(12) United States Patent
Saito

(10) Patent No.: US 12,160,496 B2
(45) Date of Patent: Dec. 3, 2024

(54) SIGNAL TRANSMISSION DEVICE

(71) Applicant: Rohm Co., Ltd., Kyoto (JP)

(72) Inventor: Koji Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/339,731

(22) Filed: Jun. 22, 2023

(65) Prior Publication Data

US 2023/0421348 A1 Dec. 28, 2023

(30) Foreign Application Priority Data

Jun. 24, 2022 (JP) .................................. 2022-101808

(51) Int. Cl.
*H04L 7/00* (2006.01)
*H03L 7/189* (2006.01)
*H04L 7/033* (2006.01)

(52) U.S. Cl.
CPC .............. *H04L 7/033* (2013.01); *H03L 7/189* (2013.01); *H04L 7/0033* (2013.01)

(58) Field of Classification Search
CPC ..... H04L 7/0337; H04L 7/0334; H04L 27/14; H04L 27/184; H04L 27/156; H04L 7/0037; H03L 7/091; H03L 7/00; H04B 10/556; H03C 3/0933; H03D 3/02; G06F 1/12; G06F 1/10
USPC .................................. 375/355, 376; 242/125
See application file for complete search history.

(56) References Cited

U.S. PATENT DOCUMENTS

| | | | | |
|---|---|---|---|---|
| 9,602,162 | B2 * | 3/2017 | Feldtkeller | H03K 5/06 |
| 10,211,927 | B1 * | 2/2019 | Ishihara | H03C 3/0933 |
| 2006/0008075 | A1 * | 1/2006 | Scott | H04M 1/738 |
| | | | | 379/399.01 |
| 2010/0091688 | A1 * | 4/2010 | Staszewski | H04L 27/3863 |
| | | | | 370/342 |
| 2012/0184233 | A1 * | 7/2012 | Jones | H03F 3/245 |
| | | | | 455/234.1 |
| 2016/0087914 | A1 * | 3/2016 | Goswami | H04B 5/75 |
| | | | | 370/467 |
| 2020/0145097 | A1 * | 5/2020 | Getzin | H04L 5/14 |
| 2023/0297131 | A1 * | 9/2023 | Wang | H03K 17/691 |
| | | | | 713/400 |

FOREIGN PATENT DOCUMENTS

JP 2017188903 10/2017

\* cited by examiner

*Primary Examiner* — Khai Tran
(74) *Attorney, Agent, or Firm* — Fish & Richardson P.C.

(57) ABSTRACT

A signal transmission device includes a first pulse transmitting circuit configured to generate a first transmission pulse signal in synchronization with one of a rising edge and a falling edge of a first reference clock signal, a first pulse receiving circuit configured to receive a first reception pulse signal and generate a second reference clock signal, a first insulation communication circuit configured to transmit the first transmission pulse signal as the first reception pulse signal while insulating between the first pulse transmitting circuit and the first pulse receiving circuit, and a drive clock signal generating circuit configured to generate a drive clock signal having a predetermined oscillation frequency and a predetermined duty or a predetermined pulse width in synchronization with the second reference clock signal.

10 Claims, 18 Drawing Sheets

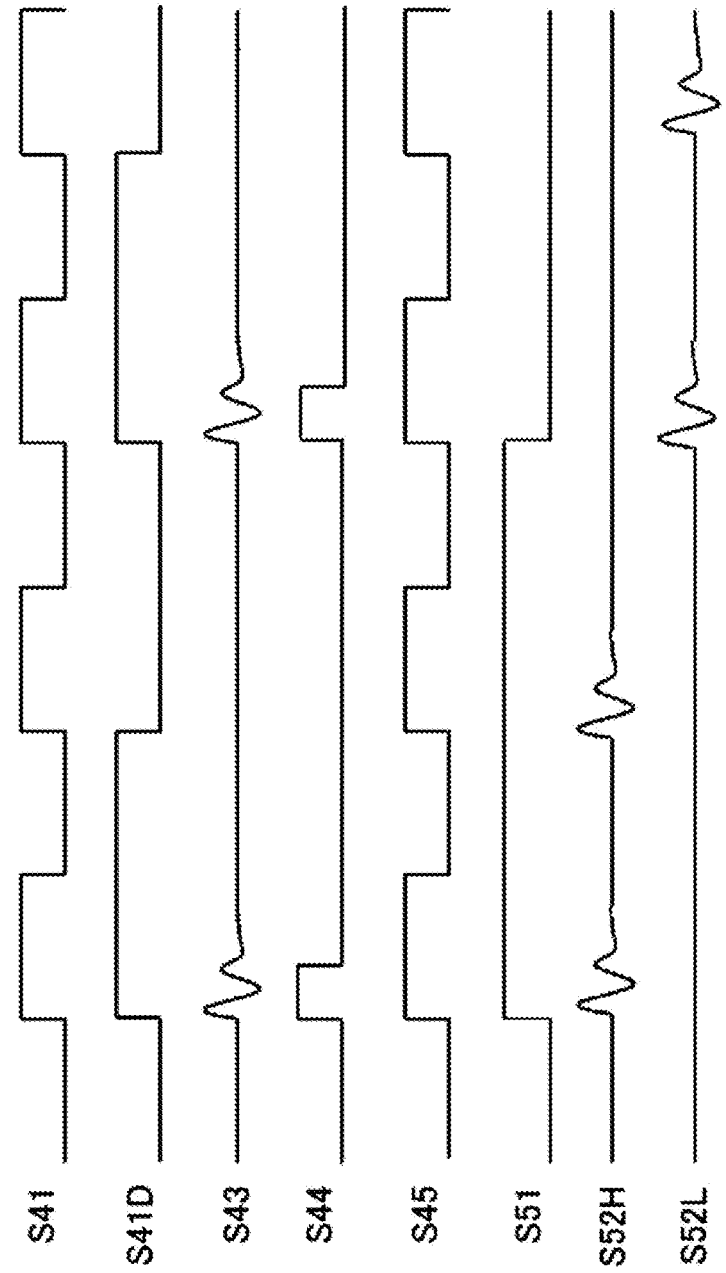

SIGNAL TRANSMISSION DEVICE

CROSS-REFERENCE TO RELATED APPLICATION

This application is based upon and claims the benefit of priority from Japanese Patent Application No. 2022-101808, filed on Jun. 24, 2022, the entire contents of which are incorporated herein by reference.

TECHNICAL FIELD

The present disclosure relates to a signal transmission device.

BACKGROUND

In the related art, signal transmission devices that transmit pulse signals while insulating between input and output have been used in various applications (power supply devices, motor drive devices, etc.).

BRIEF DESCRIPTION OF DRAWINGS

The accompanying drawings, which are incorporated in and constitute a part of the specification, illustrate embodiments of the present disclosure.

FIG. 18 is a diagram showing a signal transmission operation of the fifth embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Signal Transmission Device (Basic Configuration)>

Figure 1:
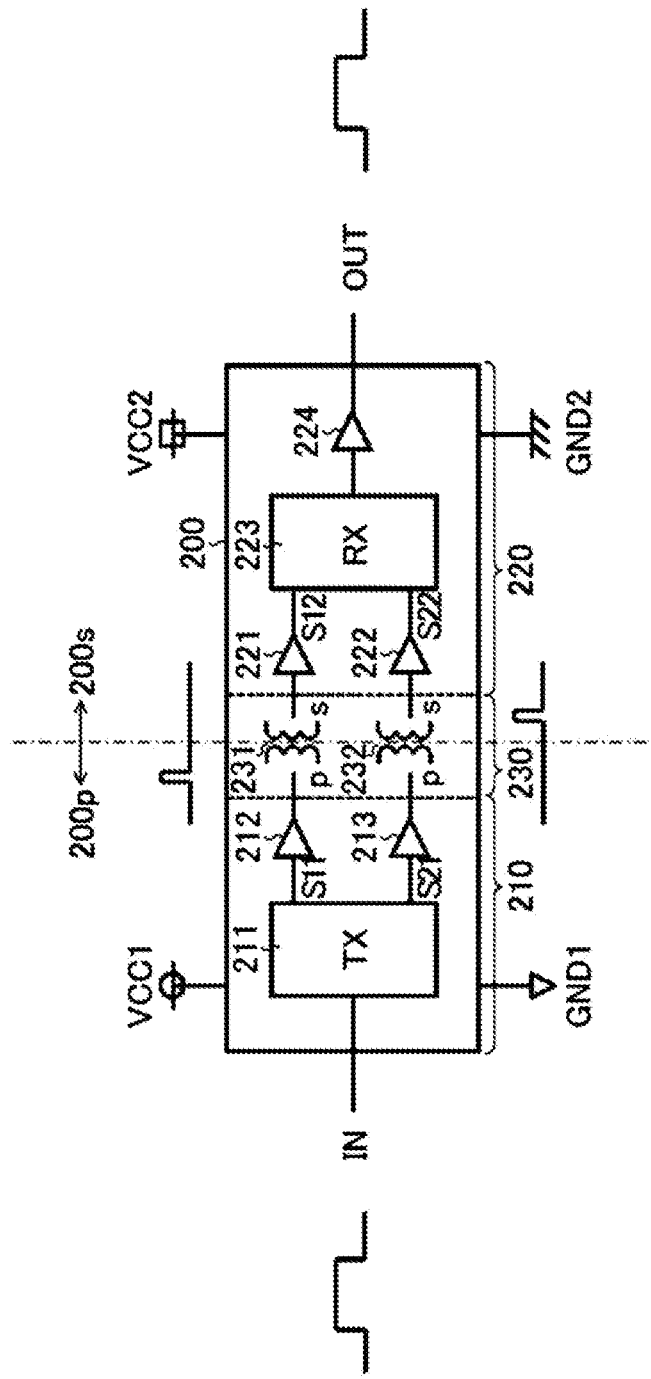
FIG. 1 is a view showing a basic configuration of a signal transmission device.

FIG. 1 is a view showing a basic configuration of a signal transmission device. The signal transmission device 200 of this configuration example is a semiconductor integrated circuit device (a so-called insulated gate driver IC) which, while insulating a primary circuit system 200$p$ (VCC1-GND1 system) and a secondary circuit system 200$s$ (VCC2-GND2 system) from each other, transmits a pulse signal from the primary circuit system 200$p$ to the secondary circuit system 200$s$, and drives a gate of a switch element (not shown) provided in the secondary circuit system 200$s$. For example, the signal transmission device 200 is formed by sealing a controller chip 210, a driver chip 220, and a transformer chip 230 in a single package.

The controller chip 210 is a semiconductor chip which operates by being supplied with a power supply voltage VCC1 (for example, a maximum of 7 V based on GND1). For example, a pulse transmitting circuit 211 and buffers 212 and 213 are integrated in the controller chip 210.

The pulse transmitting circuit 211 is a pulse generator which generates transmission pulse signals S11 and S21 in response to an input pulse signal IN. More specifically, when notifying that the input pulse signal IN is at a high level, the pulse transmitting circuit 211 pulse-drives the transmission pulse signal S11 (outputs a single-shot or multiple-shot transmission pulse). When notifying that the input pulse signal IN is at a low level, the pulse transmitting circuit 211 pulse-drives the transmission pulse signal S21. That is, the pulse transmitting circuit 211 pulse-drives one of the transmission pulse signals S11 and S21 according to a logic level of the input pulse signal IN.

The buffer 212 receives an input of the transmission pulse signal S11 from the pulse transmitting circuit 211 and pulse-drives the transformer chip 230 (specifically, a transformer 231).

The buffer 213 receives the input of the transmission pulse signal S21 from the pulse transmitting circuit 211 and pulse-drives the transformer chip 230 (specifically, a transformer 232).

The driver chip 220 is a semiconductor chip that operates by receiving a power supply voltage VCC2 (for example, a maximum of 30 V based on GND2). For example, buffers 221 and 222, a pulse receiving circuit 223, and a driver 224 are integrated in the driver chip 220.

The buffer 221 shapes a waveform of a reception pulse signal S12 induced in the transformer chip 230 (specifically, the transformer 231) and outputs it to the pulse receiving circuit 223.

The buffer 222 shapes a waveform of a reception pulse signal S22 induced in the transformer chip 230 (specifically, the transformer 232) and outputs it to the pulse receiving circuit 223.

The pulse receiving circuit 223 generates an output pulse signal OUT by driving the driver 224 in response to the reception pulse signals S12 and S22 input via the buffers 221 and 222. More specifically, the pulse receiving circuit 223 drives the driver 224 so as to raise the output pulse signal OUT to a high level in response to the pulse drive of the reception pulse signal S12 while lowering the output pulse signal OUT to a low level in response to the pulse drive of the reception pulse signal S22. That is, the pulse receiving circuit 223 switches the logic level of the output pulse signal OUT according to the logic level of the input pulse signal IN. As the pulse receiving circuit 223, for example, an RS flip-flop may be used.

The driver 224 generates the output pulse signal OUT based on the drive control of the pulse receiving circuit 223.

The transformer chip 230 provides a direct current (DC) insulation between the controller chip 210 and the driver chip 220 by using the transformers 231 and 232 and outputs the transmission pulse signals S11 and S21 input from the pulse transmitting circuit 211, as the reception pulse signals S12 and S22, respectively, to the pulse receiving circuit 223. In the present disclosure, the term "DC insulation" means that an object to be insulated is not connected by a conductor.

More specifically, the transformer 231 outputs the reception pulse signal S12 from a secondary side coil 231s in response to the transmission pulse signal S11 input to a primary side coil 231p. On the other hand, the transformer 232 outputs the reception pulse signal S22 from a secondary side coil 232s in response to the transmission pulse signal S21 input to a primary side coil 232p.

Thus, due to characteristics of a spiral coil used for inter-insulation communication, the input pulse signal IN is separated into the two transmission pulse signals S11 and S21 (corresponding to a rise signal and a fall signal) and then transmitted from the primary circuit system 200p to the secondary circuit system 200s via the two transformers 231 and 232.

The signal transmission device 200 of this configuration example independently has a transformer chip 230 on which only the transformers 231 and 232 are mounted, separately from the controller chip 210 and the driver chip 220, and is formed by sealing these three chips in a single package.

With such a configuration, both the controller chip 210 and the driver chip 220 can be formed by a general low-to-medium withstand voltage process (withstand voltage of several V to several tens of V), so that it is not needed to use a dedicated high withstand voltage process (several kV breakdown voltage) and it is possible to reduce manufacturing costs.

The signal transmission device 200 can be suitably used, for example, as a power supply device or a motor drive device for in-vehicle equipment mounted in a vehicle. The above vehicle includes an electric vehicle (xEV such as BEV (battery electric vehicle), HEV (hybrid electric vehicle), PHEV/PHV (plug-in hybrid electric vehicle/plug-in hybrid vehicle), or FCEV/FCV (fuel cell electric vehicle/fuel cell vehicle) as well as an engine vehicle.

<Transformer Chip (Basic Structure)>

Figure 2:
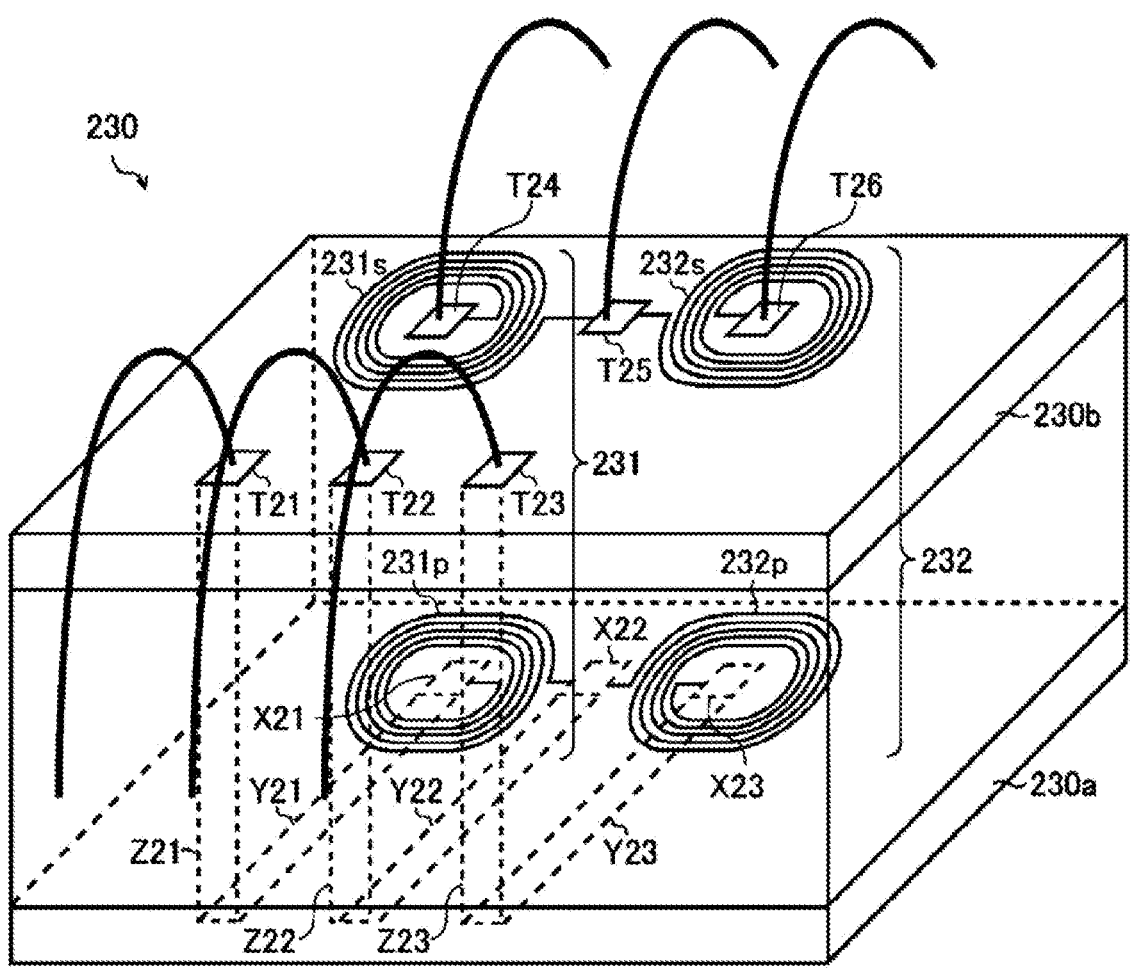
FIG. 2 is a view showing a basic structure of a transformer chip.

Next, a basic structure of the transformer chip 230 will be described. FIG. 2 is a view showing the basic structure of the transformer chip 230. In the transformer chip 230 of this figure, the transformer 231 includes the primary side coil 231p and the secondary side coil 231s facing each other in a vertical direction. The transformer 232 includes the primary side coil 232p and the secondary side coil 232s facing each other in a vertical direction.

The primary side coils 231p and 232p are both formed on a first wiring layer (lower layer in this FIG. 230a of the transformer chip 230. The secondary side coils 231s and 232s are both formed on a second wiring layer (upper layer in this FIG. 230b of the transformer chip 230. The secondary side coil 231s is arranged directly above the primary side coil 231p and faces the primary side coil 231p. Further, the secondary side coil 232s is arranged directly above the primary side coil 232p and faces the primary side coil 232p.

The primary side coil 231p is spirally laid so as to surround a periphery of an internal terminal X21 in a clockwise direction, with a first end connected to the internal terminal X21, a start point, and with a second end corresponding to an end point connected to an internal terminal X22. On the other hand, the primary side coil 232p is spirally laid so as to surround a periphery of an internal terminal X23 in a counterclockwise direction, with a first end connected to the internal terminal X23, as a start point, and with a second end corresponding to an end point connected to the internal terminal X22. The internal terminals X21, X22, and X23 are linearly arranged in the order shown.

The internal terminal X21 is connected to an external terminal T21 of the second layer 230b via a conductive wiring Y21 and a via Z21. The internal terminal X22 is connected to an external terminal T22 of the second layer 230b via a conductive wiring Y22 and a via Z22. The internal terminal X23 is connected to an external terminal T23 of the second layer 230b via a conductive wiring Y23 and a via Z23. The external terminals T21 to T23 are linearly arranged side by side and used for wire bonding with the controller chip 210.

The secondary side coil 231s is spirally laid so as to surround a periphery of an external terminal T24 in a counterclockwise direction, with a first end connected to the external terminal T24, as a start point, and with a second end corresponding to an end point connected to an external terminal T25. On the other hand, the secondary side coil 232s is spirally laid so as to surround a periphery of an external terminal T26 in a clockwise direction, with a first end connected to the external terminal T26, as a start point, and with a second end corresponding to an end point connected to the external terminal T25. The external terminals T24, T25, and T26 are linearly arranged in the order shown in the figure and used for wire bonding with the driver chip 220.

The secondary side coils 231s and 232s are AC-connected to the primary side coils 231p and 232p by magnetic coupling, respectively, and are DC-insulated from the primary side coils 231p and 232p. That is, the driver chip 220 is AC-connected to the controller chip 210 via the transformer chip 230 and is DC-insulated from the controller chip 210 by the transformer chip 230.

<Transformer Chip (Two-Channel Type)>

Figure 3:
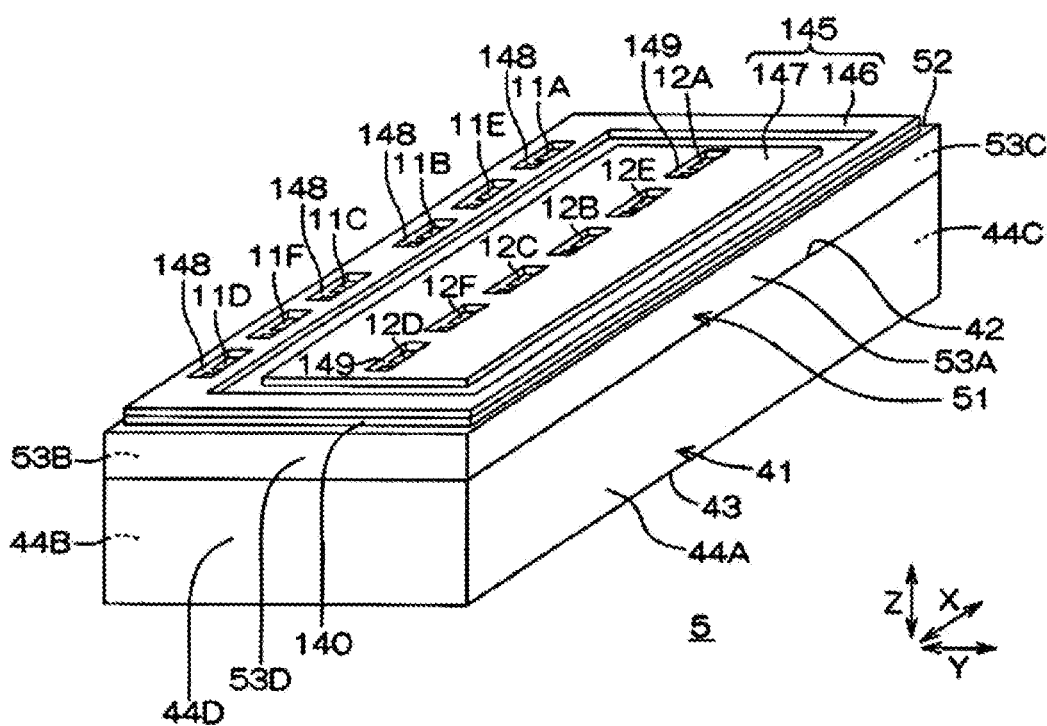
FIG. 3 is a perspective view of a semiconductor device used as a two-channel transformer chip.
Figure 4:
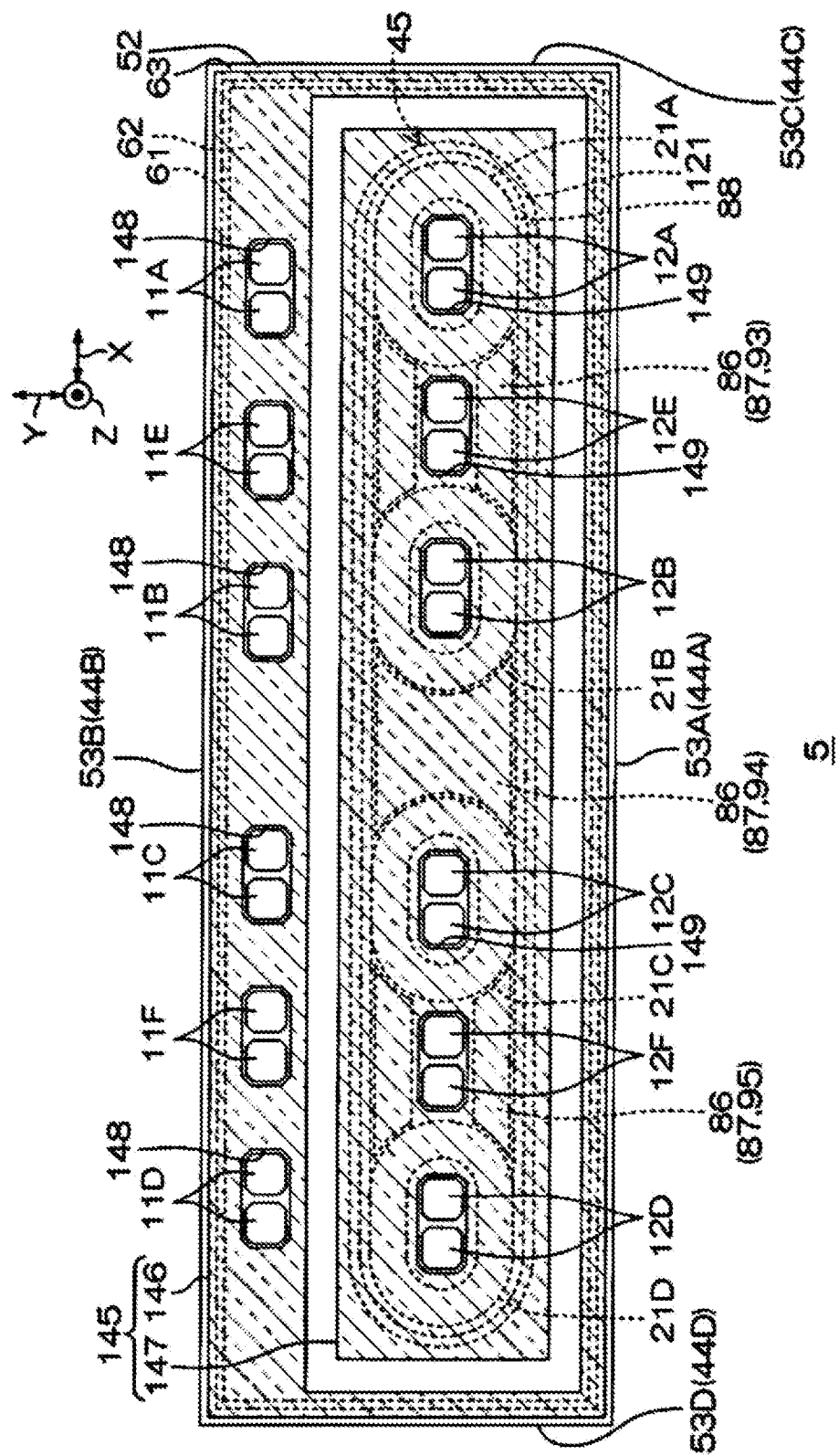
FIG. 4 is a plan view of the semiconductor device shown in FIG. 3.
Figure 5:
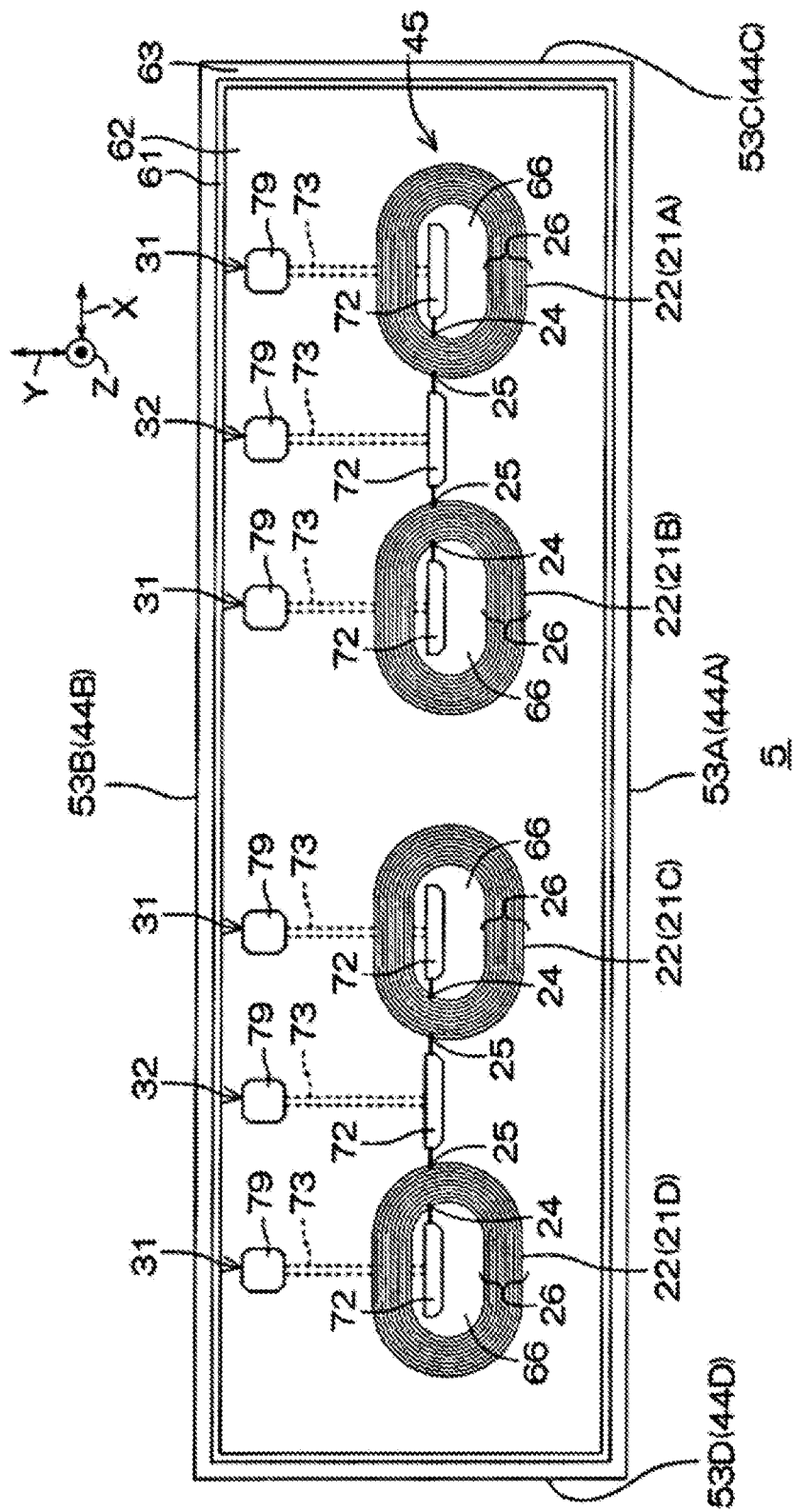
FIG. 5 is a plan view showing a layer in which a low-potential coil is formed in the semiconductor device of FIG. 3.
Figure 6:
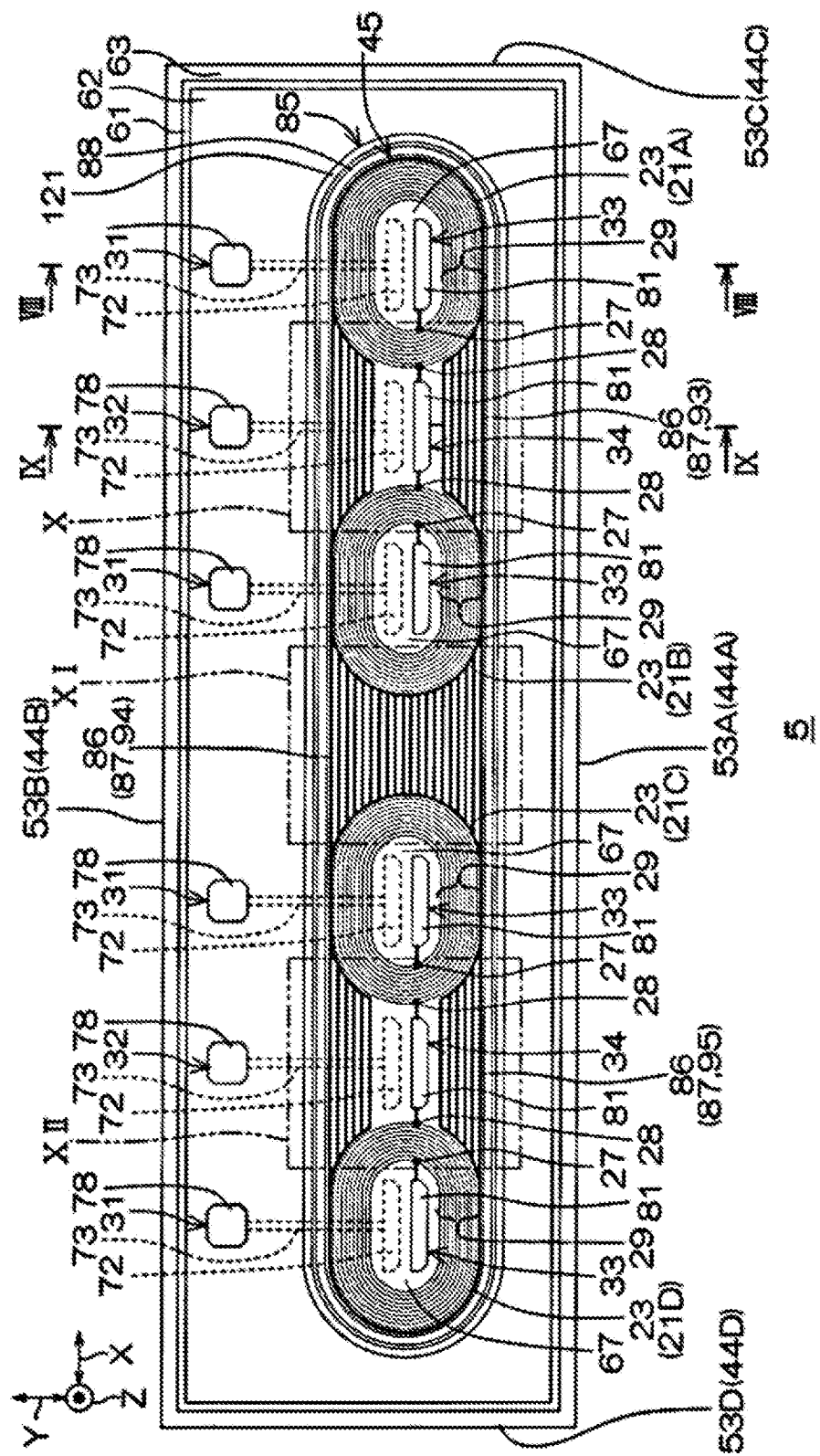
FIG. 6 is a plan view showing a layer in which a high-potential coil is formed in the semiconductor device of FIG. 3.
Figure 7:
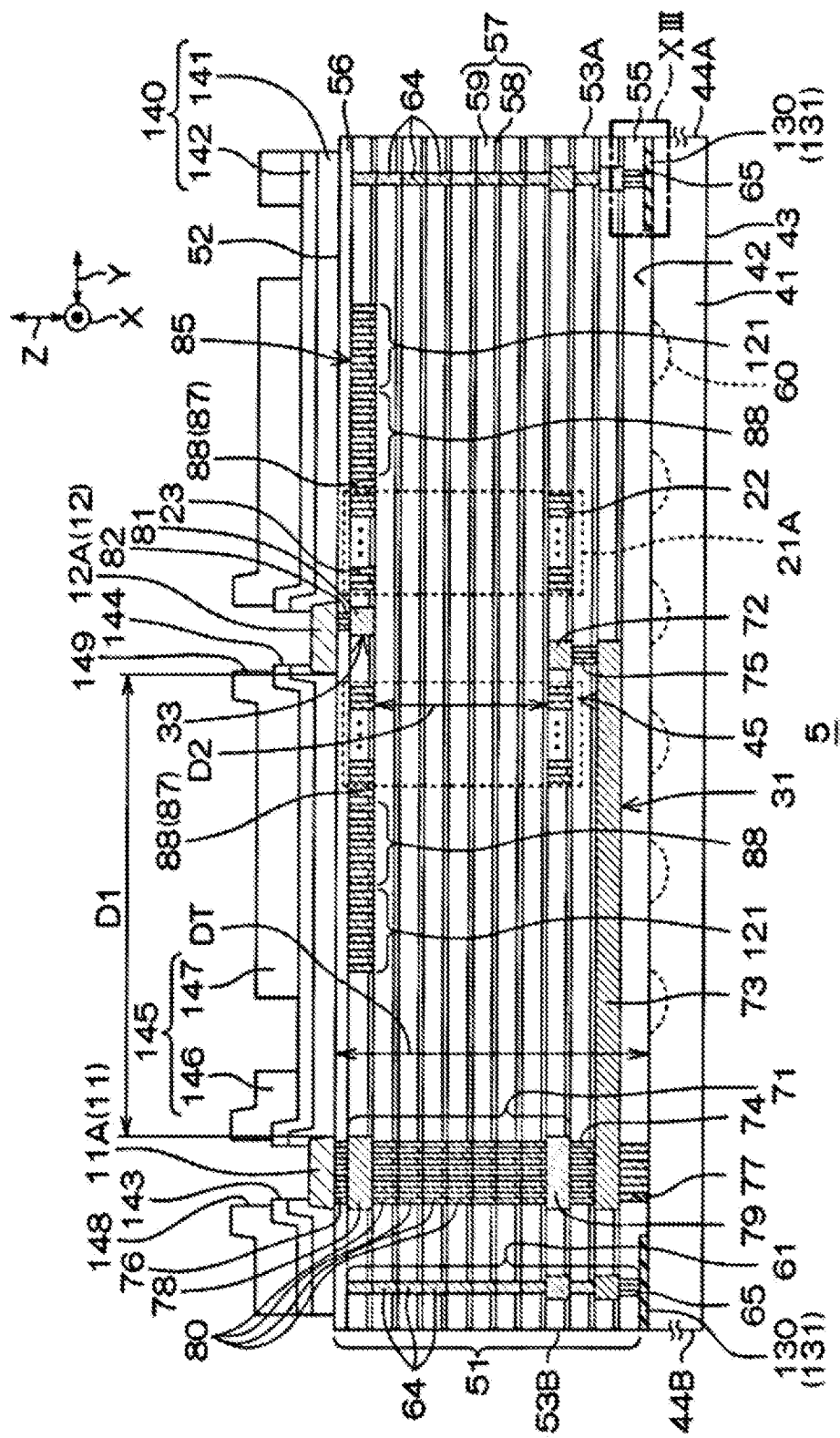
FIG. 7 is a cross-sectional view taken along line VIII-VIII shown in FIG. 6.
Figure 8:
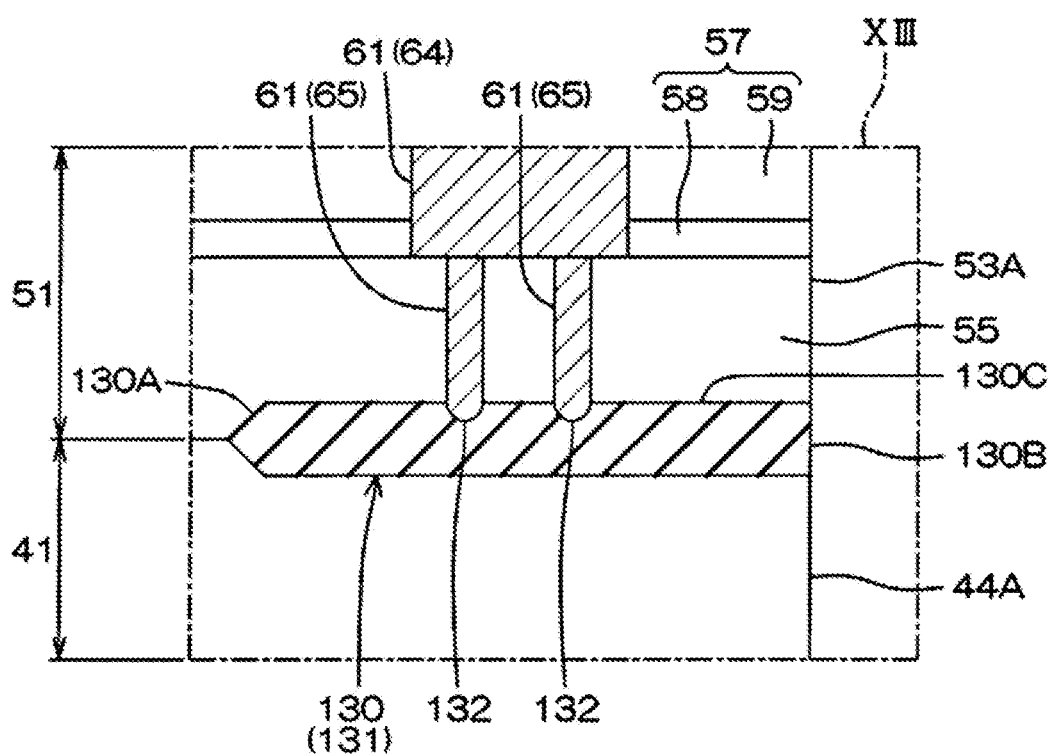
FIG. 8 is a view showing enlargement (isolation structure) of a region XIII shown in FIG. 7.

FIG. 3 is a perspective view showing a semiconductor device 5 used as a two-channel transformer chip. FIG. 4 is a plan view of the semiconductor device 5 shown in FIG. 3. FIG. FIG. 5 is a plan view showing a layer in which a low-potential coil 22 (corresponding to a primary side coil of a transformer) is formed in the semiconductor device 5 shown in FIG. 3. FIG. 6 is a plan view showing a layer in which a high-potential coil 23 (corresponding to a secondary side coil of the transformer) is formed in the semiconductor device 5 shown in FIG. 3. FIG. 7 is a cross-sectional view taken along line VIII-VIII shown in FIG. 6. FIG. 8 is an enlarged view of a region XIII shown in FIG. 7, which shows an isolation structure 130.

Referring to FIGS. 3 to 7, the semiconductor device 5 includes a semiconductor chip 41 having a rectangular parallelepiped shape. The semiconductor chip 41 includes at least one selected from the group of silicon, a wide band gap semiconductor, and a compound semiconductor.

The wide band gap semiconductor is formed with a semiconductor that exceeds a band gap of silicon (approximately 1.12 eV). It is desirable that the band gap of the wide band gap semiconductor is 2.0 eV or more. The wide band gap semiconductor may be SiC (silicon carbide). The compound semiconductor may be a group III-V compound semiconductor. The compound semiconductor may contain at least one selected from the group of AlN (aluminum nitride), InN (indium nitride), GaN (gallium nitride), and GaAs (gallium arsenide).

In this embodiment, the semiconductor chip 41 includes a semiconductor substrate made of silicon. The semiconductor chip 41 may be an epitaxial substrate having a laminated structure including a semiconductor substrate made of silicon and an epitaxial layer made of silicon. The conductivity type of the semiconductor substrate may be an n-type or a p-type. The epitaxial layer may be an n-type or a p-type.

The semiconductor chip 41 has a first main surface 42 on a first side, a second main surface 43 on a second side, and chip sidewalls 44A to 44D connecting the first main surface 42 and the second main surface 43. The first main surface 42 and the second main surface 43 are formed in a quadrangular shape (rectangular shape in this embodiment) in a plan view as seen from their normal direction Z (hereinafter abbreviated as a "plan view").

The chip sidewalls 44A to 44D include a first chip sidewall 44A, a second chip sidewall 44B, a third chip sidewall 44C, and a fourth chip sidewall 44D. The first chip sidewall 44A and the second chip sidewall 44B form long sides of the semiconductor chip 41. The first chip sidewall 44A and the second chip sidewall 44B extend along a first direction X and face a second direction Y. The third chip sidewall 44C and the fourth chip sidewall 44D form short sides of the semiconductor chip 41. The third chip sidewall 44C and the fourth chip sidewall 44D extend in the second direction Y and face the first direction X. The chip sidewalls 44A to 44D are formed with polished surfaces.

The semiconductor device 5 further includes an insulating layer 51 formed on the first main surface 42 of the semiconductor chip 41. The insulating layer 51 has an insulating main surface 52 and insulating sidewalls 53A to 53D. The insulating main surface 52 is formed in a quadrangular shape (rectangular shape in this embodiment) matching the first main surface 42 in a plan view. The insulating main surface 52 extends parallel to the first main surface 42.

The insulating sidewalls 53A to 53D include a first insulating sidewall 53A, a second insulating sidewall 53B, a third insulating sidewall 53C, and a fourth insulating sidewall 53D. The insulating sidewalls 53A to 53D extend from a peripheral edge of the insulating main surface 52 toward the semiconductor chip 41 and are connected to the chip sidewalls 44A to 44D. Specifically, the insulating sidewalls 53A to 53D are formed flush with the chip sidewalls 44A to 44D. The insulating sidewalls 53A to 53D are formed with polished surfaces flush with the chip sidewalls 44A to 44D.

The insulating layer 51 has a multi-layer insulating laminated structure including a bottom insulating layer 55, a top insulating layer 56, and a plurality of (eleven layers in this embodiment) interlayer insulating layers 57. The bottom insulating layer 55 is an insulating layer that directly covers the first main surface 42. The top insulating layer 56 is an insulating layer that forms the insulating main surface 52. The plurality of interlayer insulating layers 57 are insulating layers interposed between the bottom insulating layer 55 and the top insulating layer 56. In this embodiment, the bottom insulating layer 55 has a single layer structure containing silicon oxide. In this embodiment, the top insulating layer 56 has a single layer structure containing silicon oxide. The thickness of the bottom insulating layer 55 and the thickness of the top insulating layer 56 may each be 1 μm or more and 3 μm or less (for example, about 2 μm).

The plurality of interlayer insulating layers 57 has a laminated structure including a first insulating layer 58 on the bottom insulating layer 55 side and a second insulating layer 59 on the top insulating layer 56 side. The first insulating layer 58 may contain silicon nitride. The first insulating layer 58 is formed as an etching stopper layer for the second insulating layer 59. The thickness of the first insulating layer 58 may be 0.1 μm or more and 1 μm or less (for example, about 0.3 μm).

The second insulating layer 59 is formed on the first insulating layer 58. The second insulating layer 59 contains an insulating material different from the first insulating layer 58. The second insulating layer 59 may contain silicon oxide. The thickness of the second insulating layer 59 may be 1 μm or more and 3 μm or less (for example, about 2 μm). It is desirable that the thickness of the second insulating layer 59 exceeds the thickness of the first insulating layer 58.

A total thickness DT of the insulating layer 51 may be 5 μm or more and 50 μm or less. The total thickness DT of the insulating layer 51 and the number of layers of the interlayer insulating layers 57 are arbitrary and are adjusted according to a dielectric withstand voltage (dielectric breakdown tolerance) to be achieved. Insulating materials for the bottom insulating layer 55, the top insulating layer 56, and the interlayer insulating layers 57 are arbitrary and are not limited to specific insulating materials.

The semiconductor device 5 includes a first functional device 45 formed in the insulating layer 51. The first functional device 45 includes one or more (plurality of, in this embodiment) transformers 21 (corresponding to the previously mentioned transformers). That is, the semiconductor device 5 is a multi-channel device including a plurality of transformers 21. The plurality of transformers 21 are formed in the inner portion of the insulating layer 51 at an interval from the insulating sidewalls 53A to 53D. The plurality of transformers 21 are formed at an interval in the first direction X.

Specifically, the plurality of transformers 21 includes a first transformer 21A, a second transformer 21B, a third transformer 21C, and a fourth transformer 21D formed in this order from the insulating sidewall 53C side toward the insulating sidewall 53D side in a plan view. The plurality of transformers 21A to 21D have the same structure. The structure of the first transformer 21A will be described below as an example. Descriptions of the structures of the second transformer 21B, the third transformer 21C, and the fourth transformer 21D are omitted because the description of the structure of the first transformer 21A applies mutatis mutandis.

Referring to FIGS. 5 to 7, the first transformer 21A includes a low-potential coil 22 and a high-potential coil 23. The low-potential coil 22 is formed within the insulating layer 51. The high-potential coil 23 is formed within the insulating layer 51 so as to face the low-potential coil 22 in the normal direction Z. In this embodiment, the low-potential coil 22 and the high-potential coil 23 are formed in a region sandwiched between the bottom insulating layer 55 and the top insulating layer 56 (that is, in the plurality of interlayer insulating layers 57).

The low-potential coil 22 is formed on the bottom insulating layer 55 (the semiconductor chip 41) side within the insulating layer 51, and the high-potential coil 23 is formed on the top insulating layer 56 (the insulating main surface 52) side with respect to the low-potential coil 22 within the insulating layer 51. That is, the high-potential coil 23 faces the semiconductor chip 41 with the low-potential coil 22 interposed therebetween. The low-potential coil 22 and the high-potential coil 23 may be arranged at any position. The high-potential coil 23 may also face the low-potential coil 22 with one or more interlayer insulating layers 57 interposed therebetween.

A distance between the low-potential coil 22 and the high-potential coil 23 (that is, the number of layers of the interlayer insulation layers 57) is appropriately adjusted according to a dielectric withstand voltage and an electric field intensity between the low-potential coil 22 and the high-potential coil 23. In this embodiment, the low-potential coil 22 is formed on the third interlayer insulating layer 57, which is counted from the bottom insulating layer 55 side. In this embodiment, the high-potential coil 23 is formed on the first interlayer insulating layer 57, which is counted from the top insulating layer 56 side.

The low-potential coil 22 is embedded by passing through the first insulating layer 58 and the second insulating layer 59 in the interlayer insulating layer 57. The low-potential coil 22 includes a first inner end 24, a first outer end 25, and a first spiral portion 26 spirally laid between the first inner end 24 and the first outer end 25. The first spiral portion 26 is laid in a spiral shape extending in an elliptical shape (oval shape) in a plan view. A portion forming the innermost peripheral edge of the first spiral portion 26 defines an elliptical first inner region 66 in a plan view.

The number of turns of the first spiral portion 26 may be five or more and thirty or less. The width of the first spiral portion 26 may be 0.1 µm or more and 5 µm or less. It is desirable that the width of the first spiral portion 26 is 1 µm or more and 3 µm or less. The width of the first spiral portion 26 is defined by a width in a direction orthogonal to a spiral direction. A first winding pitch of the first spiral portion 26 may be 0.1 µm or more and 5 µm or less. It is desirable that the first winding pitch is 1 µm or more and 3 µm or less. The first winding pitch is defined by a distance between two adjacent portions of the first spiral portion 26 in a direction orthogonal to a spiral direction.

A winding shape of the first spiral portion 26 and a planar shape of the first inner region 66 are arbitrary and are not limited to the shapes shown in FIG. 5 and the like. The first spiral portion 26 may be wound in a polygonal shape such as a triangular shape or a quadrangular shape, or a circular shape in a plan view. The first inner region 66 may be partitioned into a polygonal shape such as a triangular shape or a quadrangular shape, or a circular shape in a plan view according to the winding shape of the first spiral portion 26.

The low-potential coil 22 may contain at least one selected from the group of titanium, titanium nitride, copper, aluminum, and tungsten. The low-potential coil 22 may have a laminated structure including a barrier layer and a main body layer. The barrier layer defines a recess space within the interlayer insulating layer 57. The barrier layer may contain at least one selected from the group of titanium and titanium nitride. The main body layer may contain at least one selected from the group of copper, aluminum, and tungsten.

The high-potential coil 23 is embedded by passing through the first insulating layer 58 and the second insulating layer 59 in the interlayer insulating layer 57. The high-potential coil 23 includes a second inner end 27, a second outer end 28, and a second spiral portion 29 spirally laid between the second inner end 27 and the second outer end 28. The second spiral portion 29 is laid in a spiral shape extending in an elliptical shape (oval shape) in a plan view. In this embodiment, a portion forming the innermost peripheral edge of the second spiral portion 29 defines an elliptical second inner region 67 in a plan view. The second inner region 67 of the second spiral portion 29 faces the first inner region 66 of the first spiral portion 26 in the normal direction Z.

The number of turns of the second spiral portion 29 may be five or more and thirty or less. The number of turns of the second spiral portion 29 with respect to the number of turns of the first spiral portion 26 is adjusted according to a voltage value to be boosted. It is desirable that the number of turns of the second spiral portion 29 exceeds the number of turns of the first spiral portion 26. Of course, the number of turns of the second spiral portion 29 may be less than the number of turns of the first spiral portion 26 or may be equal to the number of turns of the first spiral portion 26.

The width of the second spiral portion 29 may be 0.1 µm or more and 5 µm or less. It is desirable that the width of the second spiral portion 29 is 1 µm or more and 3 µm or less. The width of the second spiral portion 29 is defined by a width in a direction orthogonal to a spiral direction. It is desirable that a width of the second spiral portion 29 is preferably equal to a width of the first spiral portion 26.

A second winding pitch of the second spiral portion 29 may be 0.1 µm or more and 5 µm or less. It is desirable that the second winding pitch is 1 µm or more and 3 µm or less. The second winding pitch is defined by a distance between two adjacent portions of the second spiral portion 29 in a direction orthogonal to the spiral direction. It is desirable that the second winding pitch of the second spiral portion 29 is equal to the first winding pitch of the first spiral portion 26.

A winding shape of the second spiral portion 29 and a planar shape of the second inner region 67 are arbitrary and are not limited to the shapes shown in FIG. 6 and the like. The second spiral portion 29 may be wound in a polygonal shape such as a triangular shape or a quadrangular shape, or a circular shape in a plan view. The second inner region 67 may be partitioned into a polygonal shape such as a triangular shape or a quadrangular shape, or a circular shape in a plan view according to the winding shape of the second spiral portion 29.

It is desirable that the high-potential coil 23 is made of the same conductive material as the low-potential coil 22. That is, similar to the low-potential coil 22, it is desirable that the high-potential coil 23 includes a barrier layer and a main body layer.

Referring to FIG. 4, the semiconductor device 5 includes a plurality of (twelve in this figure) low-potential terminals 11A to 11F and a plurality of (twelve in this figure) high-potential terminals 12A to 12F. The plurality of low-potential terminals 11A to 11F are electrically connected to the low-potential coils 22 of the corresponding transformers 21A to 21D, respectively. The plurality of high-potential terminals 12A to 12F are electrically connected to the high-potential coils 23 of the corresponding transformers 21A to 21D, respectively.

The plurality of low-potential terminals 11A to 11F are formed on the insulating main surface 52 of the insulating layer 51. Specifically, the plurality of low-potential terminals 11A to 11F are formed in a region on the insulating sidewall 53B side at an interval from the plurality of transformers 21A to 21D in the second direction Y and are arranged at an interval in the first direction X.

The plurality of low-potential terminals 11A to 11F includes a first low-potential terminal 11A, a second low-potential terminal 11B, a third low-potential terminal 11C, a fourth low-potential terminal 11D, a fifth low-potential terminal 11E, and a sixth low-potential terminal 11F. In this embodiment, the plurality of low-potential terminals 11A to 11F are formed two by two. The number of low-potential terminals 11A to 11F is arbitrary.

The first low-potential terminal 11A faces the first transformer 21A in the second direction Y in a plan view. The second low-potential terminal 11B faces the second transformer 21B in the second direction Y in a plan view. The third low-potential terminal 11C faces the third transformer 21C in the second direction Y in a plan view. The fourth low-potential terminal 11D faces the fourth transformer 21D in the second direction Y in a plan view. The fifth low-potential terminal 11E is formed in a region between the first low-potential terminal 11A and the second low-potential terminal 11B in a plan view. The sixth low-potential terminal 11F is formed in a region between the third low-potential terminal 11C and the fourth low-potential terminal 11D in a plan view.

The first low-potential terminal 11A is electrically connected to the first inner end 24 of the first transformer 21A (the low-potential coil 22). The second low-potential terminal 11B is electrically connected to the first inner end 24 of the second transformer 21B (the low-potential coil 22). The third low-potential terminal 11C is electrically connected to the first inner end 24 of the third transformer 21C (the low-potential coil 22). The fourth low-potential terminal 11D is electrically connected to the first inner end 24 of the fourth transformer 21D (the low-potential coil 22).

The fifth low-potential terminal 11E is electrically connected to the first outer end 25 of the first transformer 21A (the low-potential coil 22) and the first outer end 25 of the second transformer 21B (the low-potential coil 22). The sixth low-potential terminal 11F is electrically connected to the first outer end 25 of the third transformer 21C (the low-potential coil 22) and the first outer end 25 of the fourth transformer 21D (the low-potential coil 22).

The plurality of high-potential terminals 12A to 12F are formed on the insulating main surface 52 of the insulating layer 51 at an interval from the plurality of low-potential terminals 11. Specifically, the plurality of high-potential terminals 12A to 12F are formed in a region on the insulating sidewall 53A side at an interval from the plurality of low-potential terminals 11 in the second direction Y and are arranged at an interval in the first direction X.

The plurality of high-potential terminals 12A and 12F are formed in regions close to the corresponding transformers 21A to 21D, respectively, in a plan view. When the plurality of high-potential terminals 12A to 12F are close to the transformers 21A to 21D, it means that a distance between the plurality of high-potential terminals 12A to 12F and the transformers 21A to 21D is less than a distance between the plurality of low-potential terminals 11A to 11F and the plurality of high-potential terminals 12A to 12F in a plan view.

Specifically, the plurality of high-potential terminals 12A to 12F are formed at an interval along the first direction X so as to face the plurality of transformers 21A to 21D along the first direction X in a plan view. More specifically, the plurality of high-potential terminals 12A to 12F are formed at an interval along the first direction X so as to be located in a region between the second inner region 67 of the high-potential coil 23 and an adjacent high-potential coil 23 in a plan view. As a result, the plurality of high-potential terminals 12A to 12F are arranged side by side with the plurality of transformers 21A to 21D in the first direction X in a plan view.

The plurality of high-potential terminals 12A to 12F includes a first high-potential terminal 12A, a second high-potential terminal 12B, a third high-potential terminal 12C, a fourth high-potential terminal 12D, a fifth high-potential terminal 12E, and a sixth high-potential terminal 12F. In this embodiment, the plurality of high-potential terminals 12A to 12F are formed two by two. The number of high-potential terminals 12A to 12F is arbitrary.

The first high-potential terminal 12A is formed in the second inner region 67 of the first transformer 21A (the high-potential coil 23) in a plan view. The second high-potential terminal 12B is formed in the second inner region 67 of the second transformer 21B (the high-potential coil 23) in a plan view. The third high-potential terminal 12C is formed in the second inner region 67 of the third transformer 21C (the high-potential coil 23) in a plan view. The fourth high-potential terminal 12D is formed in the second inner region 67 of the fourth transformer 21D (the high-potential coil 23) in a plan view. The fifth high-potential terminal 12E is formed in a region between the first transformer 21A and the second transformer 21B in a plan view. The sixth high-potential terminal 12F is formed in a region between the third transformer 21C and the fourth transformer 21D in a plan view.

The first high-potential terminal 12A is electrically connected to the second inner end 27 of the first transformer 21A (the high-potential coil 23). The second high-potential terminal 12B is electrically connected to the second inner end 27 of the second transformer 21B (the high-potential coil 23). The third high-potential terminal 12C is electrically connected to the second inner end 27 of the third transformer 21C (the high-potential coil 23). The fourth high-potential terminal 12D is electrically connected to the second inner end 27 of the fourth transformer 21D (the high-potential coil 23).

The fifth high-potential terminal 12E is electrically connected to the second outer end 28 of the first transformer 21A (the high-potential coil 23) and the second outer end 28 of the second transformer 21B (the high-potential coil 23). The sixth high-potential terminal 12F is electrically connected to the second outer end 28 of the third transformer 21C (the high-potential coil 23) and the second outer end 28 of the fourth transformer 21D (the high-potential coil 23).

Referring to FIGS. 5 to 7, the semiconductor device 5 includes a first low-potential wiring 31, a second low-potential wiring 32, a first high-potential wiring 33, and a second high-potential wiring 34 formed in the insulating layer 51. In this embodiment, a plurality of first low-potential wirings 31, a plurality of second low-potential wirings 32, a plurality of first high-potential wirings 33, and a plurality of second high-potential wirings 34 are formed.

The first low-potential wiring 31 and the second low-potential wiring 32 fix the low-potential coil 22 of the first transformer 21A and the low-potential coil 22 of the second transformer 21B to the same potential. Further, the first low-potential wiring 31 and the second low-potential wiring 32 fix the low-potential coil 22 of the third transformer 21C and the low-potential coil 22 of the fourth transformer 21D to the same potential. In this embodiment, the first low-potential wiring 31 and the second low-potential wiring 32 fix all the low-potential coils 22 of the transformers 21A to 21D to the same potential.

The first high-potential wiring 33 and the second high-potential wiring 34 fix the high-potential coil 23 of the first transformer 21A and the high-potential coil 23 of the second transformer 21B to the same potential. Further, the first high-potential wiring 33 and the second high-potential wiring 34 fix the high-potential coil 23 of the third transformer 21C and the high-potential coil 23 of the fourth transformer 21D to the same potential. In this embodiment, the first high-potential wiring 33 and the second high-potential wiring 34 fix all the high-potential coils 23 of the transformers 21A to 21D at the same potential.

The plurality of first low-potential wirings 31 are electrically connected to the corresponding low-potential terminals 11A to 11D and the first inner ends 24 of the corresponding transformers 21A to 21D (the low-potential coils 22), respectively. The plurality of first low-potential wirings 31 have the same structure. The structure of the first low-potential wiring 31 connected to the first low-potential terminal 11A and the first transformer 21A will be described below as an example. The description of the structure of the other first low-potential wirings 31 is omitted because the description of the structure of the first low-potential wiring 31 connected to the first transformer 21A applies mutatis mutandis.

The first low-potential wiring 31 includes a through-wiring 71, a low-potential connection wiring 72, a lead-out wiring 73, a first connection plug electrode 74, a second connection plug electrode 75, one or more (plurality of, in this embodiment) pad plug electrodes 76, and one or more (plurality of, in this embodiment) substrate plug electrodes 77.

It is desirable that the through-wiring 71, the low-potential connection wiring 72, the lead-out wiring 73, the first connection plug electrode 74, the second connection plug electrode 75, the pad plug electrodes 76, and the substrate plug electrodes 77 are made of the same conductive material as the low-potential coil 22 and the like. That is, similar to the low-potential coil 22 and the like, it is desirable that the through-wiring 71, the low-potential connection wiring 72, the lead-out wiring 73, the first connection plug electrode 74, the second connection plug electrode 75, the pad plug electrodes 76, and the substrate plug electrodes 77 include a barrier layer and a main body layer.

The through-wiring 71 penetrates the plurality of interlayer insulating layers 57 in the insulating layer 51 and extends in a columnar shape extending along the normal direction Z. In this embodiment, the through-wiring 71 is formed in a region between the bottom insulating layer 55 and the top insulating layer 56 in the insulating layer 51. The through-wiring 71 has an upper end portion on the top insulating layer 56 side and a lower end portion on the bottom insulating layer 55 side. The upper end portion of the through-wiring 71 is formed in the same interlayer insulating layer 57 as the high-potential coil 23 and is covered with the top insulating layer 56. The lower end of the through-wiring 71 is formed on the same interlayer insulating layer 57 as the low-potential coil 22.

In this embodiment, the through-wiring 71 includes a first electrode layer 78, a second electrode layer 79, and a plurality of wiring plug electrodes 80. In the through-wiring 71, the first electrode layer 78, the second electrode layer 79, and the wiring plug electrodes 80 are made of the same conductive material as the low-potential coil 22 and the like. That is, similar to the low-potential coil 22 and the like, the first electrode layer 78, the second electrode layer 79, and the wiring plug electrodes 80 include a barrier layer and a main body layer.

The first electrode layer 78 forms the upper end portion of the through-wiring 71. The second electrode layer 79 forms the lower end portion of the through-wiring 71. The first electrode layer 78 is formed in an island shape and faces the low-potential terminal 11 (the first low-potential terminal 11A) in the normal direction Z. The second electrode layer 79 is formed in an island shape and faces the first electrode layer 78 in the normal direction Z.

The plurality of wiring plug electrodes 80 are buried in the plurality of interlayer insulating layers 57 located between the first electrode layer 78 and the second electrode layer 79, respectively. The plurality of wiring plug electrodes 80 are stacked from the bottom insulating layer 55 toward the top insulating layer 56 so as to be electrically connected to each other, and electrically connect the first electrode layer 78 and the second electrode layer 79 to each other. The plurality of wiring plug electrodes 80 each have a plane area less than the plane area of the first electrode layer 78 and the plane area of the second electrode layer 79.

The number of layers of the plurality of wiring plug electrodes 80 is equal to the number of layers of the plurality of interlayer insulating layers 57. In this embodiment, although six wiring plug electrodes 80 are buried in each interlayer insulating layer 57, the number of wiring plug electrodes 80 buried in each interlayer insulating layer 57 is arbitrary. Of course, one or more wiring plug electrodes 80 penetrating the plurality of interlayer insulating layers 57 may be formed.

The low-potential connection wiring 72 is formed in the first inner region 66 of the first transformer 21A (the low-potential coil 22) in the same interlayer insulating layer 57 as the low-potential coil 22. The low-potential connection wiring 72 is formed in an island shape and faces the high-potential terminal 12 (the first high-potential terminal 12A) in the normal direction Z. It is desirable that the low-potential connection wiring 72 has a plane area exceeding the plane area of the wiring plug electrode 80. The low-potential connection wiring 72 is electrically connected to the first inner end 24 of the low-potential coil 22.

The lead-out wiring 73 is formed in a region between the semiconductor chip 41 and the through-wiring 71 within the interlayer insulating layer 57. In this embodiment, the lead-out wiring 73 is formed within the first interlayer insulating layer 57 which is counted from the bottom insulating layer 55. The lead-out wiring 73 includes a first end portion on a first side, a second end portion on a second side, and a wiring portion connecting the first end portion and the second end portion. The first end portion of the lead-out wiring 73 is located in a region between the semiconductor chip 41 and the lower end portion of the through-wiring 71. The second end portion of the lead-out wiring 73 is located in a region between the semiconductor chip 41 and the low-potential connection wiring 72. The wiring portion extends along the first main surface 42 of the semiconductor chip 41 and extends in a strip shape in a region between the first end portion and the second end portion.

The first connection plug electrode 74 is formed in a region between the through-wiring 71 and the lead-out wiring 73 within the interlayer insulating layer 57 and is electrically connected to the through-wiring 71 and the first end portion of the lead-out wiring 73. The second connection plug electrode 75 is formed in a region between the low-potential connection wiring 72 and the lead-out wiring 73 within the interlayer insulating layer 57 and is electrically connected to the low-potential connection wiring 72 and the second end portion of the lead-out wiring 73.

The plurality of pad plug electrodes 76 are formed in a region between the low-potential terminal 11 (the first low-potential terminal 11A) and the through-wiring 71 within the top insulating layer 56 and are electrically connected to the low-potential terminal 11 and the upper end portion of the through-wiring 71. The plurality of substrate plug electrodes 77 are formed in a region between the semiconductor chip 41 and the lead-out wiring 73 within the bottom insulating layer 55. In this embodiment, the substrate plug electrodes 77 are formed in a region between the semiconductor chip 41 and the first end portion of the lead-out wirings 73 and are electrically connected to the semiconductor chip 41 and the first end portion of the lead-out wiring 73.

Referring to FIGS. 6 and 7, the plurality of first high-potential wirings 33 are electrically connected to the corresponding high-potential terminals 12A to 12D and the second inner end 27 of the corresponding transformers 21A to 21D (the high-potential coils 23). The plurality of first high-potential wirings 33 have the same structure. The structure of the first high-potential wiring 33 connected to the first high-potential terminal 12A and the first transformer 21A will be described below as an example. The description of the structure of the other first high-potential wirings 33 is omitted because the description of the structure of the first high-potential wiring 33 connected to the first transformer 21A applies mutatis mutandis.

The first high-potential wiring 33 includes a high-potential connection wiring 81 and one or more (plurality of, in this embodiment) pad plug electrodes 82. It is desirable that the high-potential connection wiring 81 and the pad plug electrodes 82 are made of the same conductive material as the low-potential coil 22 and the like. That is, similar to the low-potential coil 22 and the like, it is desirable that the high-potential connection wiring 81 and the pad plug electrodes 82 include a barrier layer and a main body layer.

The high-potential connection wiring 81 is formed in the second inner region 67 of the high-potential coil 23 in the same interlayer insulating layer 57 as the high-potential coil 23. The high-potential connection wiring 81 is formed in an island shape and faces the high-potential terminal 12 (the first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 in a plan view and does not face the low-potential connection wiring 72 in the normal direction Z. As a result, an insulation distance between the low-potential connection wiring 72 and the high-potential connection wiring 81 increases, and the dielectric withstand voltage of the insulation layer 51 increases accordingly.

The plurality of pad plug electrodes 82 are formed in a region between the high-potential terminal 12 (the first high-potential terminal 12A) and the high-potential connection wiring 81 within the top insulating layer 56 and are electrically connected to the high-potential terminal 12 and the high-potential connection wiring 81. Each of the plurality of pad plug electrodes 82 has a plane area smaller than the plane area of the high-potential connection wiring 81 in a plan view.

Referring to FIG. 7, it is desirable that a distance D1 between the low-potential terminals 11A to 11F and the high-potential terminals 12A to 12F exceeds a distance D2 between the low-potential coil 22 and the high-potential coil 23 (D2<D1). It is desirable that the distance D1 exceeds the total thickness DT of the plurality of interlayer insulating layers 57 (DT<D1). A ratio D2/D1 of the distance D2 to the distance D1 may be 0.01 or more and 0.1 or less. It is desirable that the distance D1 is 100 μm or more and 500 μm or less. The distance D2 may be 1 μm or more and 50 μm or less. It is desirable that the distance D2 is 5 μm or more and 25 μm or less. The values of the distance D1 and the distance D2 are arbitrary and are appropriately adjusted according to a dielectric withstand voltage to be achieved.

Referring to FIGS. 6 and 7, the semiconductor device 5 includes a dummy pattern 85 buried in the insulating layer 51 so as to be located around the transformers 21A to 21D in a plan view.

The dummy pattern 85 is formed in a pattern (discontinuous pattern) different from those of the high-potential coil 23 and the low-potential coil 22 and is independent from the transformers 21A to 21D. In other words, the dummy pattern 85 does not function as the transformers 21A to 21D. The dummy pattern 85 is formed as a shield conductor layer that shields an electric field between the low-potential coil 22 and the high-potential coil 23 in the transformers 21A to 21D and suppresses electric field concentration on the high-potential coil 23. In this embodiment, the dummy pattern 85 is laid with a line density equal to the line density of the high-potential coil 23 per unit area. The fact that the line density of the dummy pattern 85 is equal to the line density of the high-potential coil 23 means that the line density of the dummy pattern 85 falls within ±20% of the line density of the high-potential coil 23.

A depth position of the dummy pattern 85 inside the insulating layer 51 is arbitrary and is adjusted according to the electric field intensity to be alleviated. It is desirable that the dummy pattern 85 is formed in a region closer to the high-potential coil 23 than the low-potential coil 22 with respect to the normal direction Z. When the dummy pattern 85 is closer to the high-potential coil 23 with respect to the normal direction Z, it means that a distance between the dummy pattern 85 and the high-potential coil 23 is less than a distance between the dummy pattern 85 and the low-potential coil 22 with respect to the normal direction Z.

In this case, the electric field concentration on the high-potential coil 23 can be appropriately suppressed. With respect to the normal direction Z, the smaller the distance between the dummy pattern 85 and the high-potential coil 23, the more the electric field concentration on the high-potential coil 23 can be suppressed. It is desirable that the dummy pattern 85 is formed in the same interlayer insulating layer 57 as the high-potential coil 23. In this case, the electric field concentration on the high-potential coil 23 can also be suppressed appropriately. The dummy pattern 85 includes a plurality of dummy patterns having different electrical states. The dummy pattern 85 may include a high-potential dummy pattern.

A depth position of a high-potential dummy pattern 86 inside the insulating layer 51 is arbitrary and is adjusted according to the electric field intensity to be alleviated. It is desirable that the high-potential dummy pattern 86 is formed in a region closer to the high-potential coil 23 than the low-potential coil 22 with respect to the normal direction Z. When the high-potential dummy pattern 86 is closer to the high-potential coil 23 with respect to the normal direction Z, it means that a distance between the high-potential dummy pattern 86 and the high-potential coil 23 is less than a distance between the high-potential dummy pattern 86 and the low-potential coil 22 with respect to the normal direction Z2.

The dummy pattern 85 includes a floating dummy pattern formed in an electrically floating state within the insulating layer 51 so as to be located around the transformers 21A to 21D.

In this embodiment, the floating dummy pattern is laid in a dense line shape so as to partially cover and partially expose a region around the high-potential coil 23 in a plan view. The floating dummy pattern may be formed in an ended shape, or may be formed in an endless shape.

The depth position of the floating dummy pattern inside the insulating layer 51 is arbitrary and is adjusted according to the electric field intensity to be alleviated.

The number of floating lines is arbitrary and is adjusted according to the electric field to be alleviated. The floating dummy pattern may be composed of a plurality of floating lines.

Referring to FIG. 7, the semiconductor device 5 includes a second functional device 60 formed on the first main surface 42 of the semiconductor chip 41 in a device region 62. The second functional device 60 is formed using a surface layer portion of the first main surface 42 of the semiconductor chip 41 and/or a region above the first main surface 42 of the semiconductor chip 41, and is covered with the insulating layer 51 (the bottom insulating layer 55). In FIG. 7, the second functional device 60 is simply indicated by a broken line shown in the surface layer portion of the first main surface 42.

The second functional device 60 is electrically connected to the low-potential terminals 11A to 11F via a low-potential wiring and is electrically connected to the high-potential terminals 12A to 12F via a high-potential wiring. The low-potential wiring has the same structure as the first low-potential wiring 31 (the second low-potential wiring 32) except that it is laid in the insulating layer 51 so as to be connected to the second functional device 60. The high-potential wiring has the same structure as the first high-potential wiring 33 (the second high-potential wiring 34) except that it is laid in the insulating layer 51 so as to be connected to the second functional device 60. The detailed description of the low-potential wiring and the high-potential wiring related to the second functional device 60 is omitted.

The second functional device 60 may include at least one selected from the group of a passive device, a semiconductor rectifying device, and a semiconductor switching device. The second functional device 60 may include a circuit network in which any two or more of the passive device, the semiconductor rectifying device, and the semiconductor switching device are selectively combined. The circuit network may form a part or all of an integrated circuit.

The passive device may include a semiconductor passive device. The passive device may include one or both of a resistor and a capacitor. The semiconductor rectifying device may include at least one selected from the group of a pn junction diode, a PIN diode, a Zener diode, a Schottky barrier diode, and a fast recovery diode. The semiconductor switching device may include at least one selected from the group of a BJT [Bipolar Junction Transistor], a MISFET [Metal Insulator Field Effect Transistor], an IGBT [Insulated Gate Bipolar Junction Transistor], and a JFET [Junction Field Effect Transistor].

Referring to FIGS. 5 to 7, the semiconductor device 5 further includes a seal conductor 61 buried in the insulating layer 51. The seal conductor 61 is buried in the insulating layer 51 in a wall shape at an interval from the insulating sidewalls 53A to 53D in a plan view and partitions the insulating layer 51 into a device region 62 and an outer region 63. The seal conductor 61 suppresses entry of moisture and cracks from the outer region 63 into the device region 62.

The device region 62 is a region including the first functional device 45 (the plurality of transformers 21), the second functional device 60, the plurality of low-potential terminals 11, the plurality of high-potential terminals 12, the first low-potential wiring 31, the second low-potential wiring 32, the first high-potential wiring 33, the second high-potential wiring 34, and the dummy pattern 85. The outer region 63 is a region outside the device region 62.

The seal conductor 61 is electrically separated from the device region 62. Specifically, the seal conductor 61 is electrically separated from the first functional device 45 (the plurality of transformers 21), the second functional device 60, the plurality of low-potential terminals 11A to 11F, the plurality of high-potential terminals 12A to 12F, the first low-potential wiring 31, the second low-potential wiring 32, the first high-potential wiring 33, the second high-potential wiring 34, and the dummy pattern 85. More specifically, the seal conductor 61 is fixed in an electrically floating state. The seal conductor 61 does not form a current path connected to the device region 62.

The seal conductor 61 is formed in a strip shape along the insulating sidewalls 53 to 53D in a plan view. In this embodiment, the seal conductor 61 is formed in a quadrangular annular shape (specifically, a rectangular annular shape) in a plan view. Thus, the seal conductor 61 defines a quadrangular (specifically, rectangular) device region 62 in a plan view. Further, the seal conductor 61 defines a quadrangular annular (specifically, rectangular annular) outer region 63 surrounding the device region 62 in a plan view.

Specifically, the seal conductor 61 has an upper end portion on the insulating main surface 52 side, a lower end portion on the semiconductor chip 41 side, and a wall portion extending in a wall shape between the upper end portion and the lower end portion. In this embodiment, the upper end portion of the seal conductor 61 is formed at an interval from the insulating main surface 52 toward the semiconductor chip 41 and is located within the insulating layer 51. In this embodiment, the upper end portion of the seal conductor 61 is covered with the top insulating layer 56. The upper end portion of the seal conductor 61 may be covered with one or more interlayer insulation layers 57. The upper end portion of the seal conductor 61 may be exposed from the top insulating layer 56. The lower end portion of the seal conductor 61 is formed at an interval from the semiconductor chip 41 toward the upper end portion.

As above, in this embodiment, the seal conductor 61 is buried in the insulating layer 51 so as to be located on the semiconductor chip 41 side with respect to the plurality of low-potential terminals 11 and the plurality of high-potential terminals 12. Further, the seal conductor 61 faces the first functional device 45 (the plurality of transformers 21), the first low-potential wiring 31, the second low-potential wiring 32, the first high-potential wiring 33, the second high-potential wiring 34, and the dummy pattern 85 within the insulating layer 51 in a direction parallel to the insulating main surface 52. The seal conductor 61 may face a portion of the second functional device 60 within the insulating layer 51 in a direction parallel to the insulating main surface 52.

The seal conductor 61 includes a plurality of seal plug conductors 64 and one or more (plurality of, in this embodiment) seal via conductors 65. The number of seal via conductors 65 is arbitrary. The uppermost seal plug conductor 64 of the plurality of seal plug conductors 64 forms the upper end portion of the seal conductor 61. Each of the plurality of seal via conductors 65 forms the lower end portion of the seal conductor 61. It is desirable that the seal plug conductor 64 and the seal via conductor 65 are made of the same conductive material as the low-potential coil 22. That is, similar to the low-potential coil 22 and the like, it is desirable that the seal plug conductor 64 and the seal via conductor 65 include a barrier layer and a main body layer.

The plurality of seal plug conductors 64 are embedded in the plurality of interlayer insulating layers 57, respectively, and are formed in a quadrangular annular shape (specifically, a rectangular annular shape) surrounding the device region 62 in a plan view. The plurality of seal plug conductors 64 are stacked from the bottom insulating layer 55 toward the top insulating layer 56 so as to be connected to each other. The number of stacked layers of the plurality of seal plug conductors 64 is equal to the number of stacked layers of the plurality of interlayer insulating layers 57. Of course, one or more seal plug conductors 64 penetrating the plurality of interlayer insulating layers 57 may be formed.

If one annular seal conductor 61 is formed by an aggregation of the plurality of seal plug conductors 64, not all of the plurality of seal plug conductors 64 need to be annular. For example, at least one of the plurality of seal plug conductors 64 may be formed with an ended shape. Further, at least one of the plurality of seal plug conductors 64 may be divided into a plurality of ended stripe-shaped portions. However, considering a risk of moisture and cracks entering the device region 62, it is desirable that the plurality of seal plug conductors 64 are formed in an endless shape (annular shape).

The plurality of seal via conductors 65 are formed in a region between the semiconductor chip 41 and the seal plug conductors 64 in the bottom insulating layer 55. The plurality of seal via conductors 65 are formed at an interval from the semiconductor chip 41 and are connected to the seal plug conductors 64. The plurality of seal via conductors 65 have a plane area less than the plane area of the seal plug conductors 64. When a single seal via conductor 65 is formed, the single seal via conductor 65 may have a plane area equal to or larger than the plane area of the seal plug conductors 64.

A width of the seal conductor 61 may be 0.1 µm or more and 10 µm or less. It is desirable that a width of the seal conductor 61 is 1 µm or more and 5 µm or less. The width of the seal conductor 61 is defined by a width in a direction orthogonal to an extension direction of the seal conductor 61.

Referring to FIGS. 7 and 8, the semiconductor device 5 further includes an isolation structure 130 interposed between the semiconductor chip 41 and the seal conductor 61 to electrically isolate the seal conductor 61 from the semiconductor chip 41. It is desirable that the isolation structure 130 includes an insulator. In this embodiment, the isolation structure 130 is composed of a field insulating film 131 formed in the first main surface 42 of the semiconductor chip 41.

The field insulating film 131 includes at least one selected from the group of an oxide film (silicon oxide film) and a nitride film (silicon nitride film). It is desirable that the field insulating film 131 is formed of a LOCOS (local oxidation of silicon) film which is an example of an oxide film formed by oxidation of the first main surface 42 of the semiconductor chip 41. A thickness of the field insulating film 131 is arbitrary as long as it can insulate the semiconductor chip 41 and the seal conductor 61 from each other. The thickness of the field insulating film 131 may be 0.1 µm or more and 5 µm or less.

The isolation structure 130 is formed on the first main surface 42 of the semiconductor chip 41 and extends in a strip shape along the seal conductor 61 in a plan view. In this embodiment, the isolation structure 130 is formed in a quadrangular annular shape (specifically, a rectangular annular shape) in a plan view. The isolation structure 130 has a connection portion 132 to which the lower end portion (the seal via conductor 65) of the seal conductor 61 is connected. The connection portion 132 may form an anchor portion in which the lower end portion (the seal via conductor 65) of the seal conductor 61 is buried toward the semiconductor chip 41 side. Of course, the connection portion 132 may be formed flush with the main surface of the isolation structure 130.

The isolation structure 130 includes an inner end portion 130A on the device region 62 side, an outer end portion 130B on the outer region 63 side, and a main body portion 130C between the inner end portion 130A and the outer end portion 130B. The inner end portion 130A defines a region in which the second functional device 60 (that is, the device region 62) is formed in a plan view. The inner end portion 130A may be formed integrally with an insulating film (not shown) formed on the first main surface 42 of the semiconductor chip 41.

The outer end portion 130B is exposed from the chip sidewalls 44A to 44D of the semiconductor chip 41 and is connected to the chip sidewalls 44A to 44D of the semiconductor chip 41. More specifically, the outer end portion 130B is formed flush with the chip sidewalls 44A to 44D of the semiconductor chip 41. The outer end portion 130B forms a polished surface flush with and between the chip sidewalls 44A to 44D of the semiconductor chip 41 and the insulating sidewalls 53A to 53D of the insulating layer 51. Of course, in another embodiment, the outer end portion 130B may be formed in the first main surface 42 at an interval from the chip sidewalls 44A to 44D.

The main body portion 130C has a flat surface extending substantially parallel to the first main surface 42 of the semiconductor chip 41. The main body portion 130C has the connection portion 132 to which the lower end portion (the seal via conductor 65) of the seal conductor 61 is connected. The connection portion 132 is formed in a portion of the main body portion 130C at an interval from the inner end portion 130A and the outer end portion 130B. The isolation structure 130 may take various forms other than the field insulating film 131.

Referring to FIG. 7, the semiconductor device 5 further includes an inorganic insulating layer 140 formed on the insulating main surface 52 of the insulating layer 51 so as to cover the seal conductor 61. The inorganic insulating layer 140 may be called a passivation layer. The inorganic insulating layer 140 protects the insulating layer 51 and the semiconductor chip 41 from above the insulating main surface 52.

In this embodiment, the inorganic insulating layer 140 has a stacked structure including a first inorganic insulating layer 141 and a second inorganic insulating layer 142. The first inorganic insulating layer 141 may contain silicon oxide. It is desirable that the first inorganic insulating layer 141 contains USG (undoped silicate glass) which is impurity-free silicon oxide. A thickness of the first inorganic insulating layer 141 may be 50 nm or more and 5,000 nm or less. The second inorganic insulating layer 142 may contain silicon nitride. A thickness of the second inorganic insulating layer 142 may be 500 nm or more and 5,000 nm or less. By increasing a total thickness of the inorganic insulating layer 140, the dielectric withstand voltage on the high-potential coil 23 can be increased.

When the first inorganic insulating layer 141 is made of USG and the second inorganic insulating layer 142 is made of silicon nitride, the dielectric withstand voltage (V/cm) of USG exceeds the dielectric withstand voltage (V/cm) of silicon nitride. Therefore, when the inorganic insulating layer 140 is thickened, it is desirable to form the first inorganic insulating layer 141 thicker than the second inorganic insulating layer 142.

The first inorganic insulating layer 141 may contain at least one selected from the group of BPSG (boron doped phosphor silicate glass) and PSG (phosphorus silicate glass) as an example of silicon oxide. However, in this case, since impurities (boron or phosphorus) are contained in silicon oxide, it is particularly desirable to form the first inorganic insulating layer 141 made of USG in order to increase the dielectric withstand voltage on the high-potential coil 23. Of course, the inorganic insulating layer 140 may have a single layer structure consisting of either the first inorganic insulating layer 141 or the second inorganic insulating layer 142.

The inorganic insulating layer 140 covers an entire region of the seal conductor 61 and has a plurality of low-potential pad openings 143 and a plurality of high-potential pad openings 144, which are formed in regions outside the seal conductor 61. The plurality of low-potential pad openings 143 expose the plurality of low-potential terminals 11A to 11F, respectively. The plurality of high-potential pad openings 144 expose the plurality of high-potential terminals 12A to 12F, respectively. The inorganic insulating layer 140 may have an overlap portion overlying a peripheral edge portion of the low-potential terminals 11A to 11F. The inorganic insulating layer 140 may have an overlap portion overlying the peripheral edge portion of the high-potential terminals 12A to 12F.

The semiconductor device 5 further includes an organic insulating layer 145 formed on the inorganic insulating layer 140. The organic insulating layer 145 may contain a photosensitive resin. The organic insulating layer 145 may contain at least one selected from the group of polyimide, polyamide, and polybenzoxazole. In this embodiment, the organic insulating layer 145 contains polyimide. A thickness of the organic insulating layer 145 may be 1 μm or more and 50 μm or less.

It is desirable that the thickness of the organic insulating layer 145 exceeds a total thickness of the inorganic insulating layer 140. Further, it is desirable that a total thickness of the inorganic insulating layer 140 and the organic insulating layer 145 is equal to or larger than the distance D2 between the low-potential coil 22 and the high-potential coil 23. In this case, it is desirable that the total thickness of the inorganic insulating layer 140 is 2 μm or more and 10 μm or less. Further, the thickness of the organic insulating layer 145 is preferably 5 μm or more and 50 μm or less. According to these structures, it is possible to suppress the thickening of the inorganic insulating layer 140 and the organic insulating layer 145, and at the same time, it is possible to appropriately increase the dielectric withstand voltage on the high-potential coil 23 by a stacked film of the inorganic insulating layer 140 and the organic insulating layer 145.

The organic insulating layer 145 includes a first portion 146 covering a low-potential side region and a second portion 147 covering a high-potential side region. The first portion 146 covers the seal conductor 61 with the inorganic insulating layer 140 interposed therebetween. The first portion 146 has a plurality of low-potential terminal openings 148 exposing the plurality of low-potential terminals 11A to 11F (the low-potential pad openings 143), respectively, in a region outside the seal conductor 61. The first portion 146 may have an overlap portion overlying the peripheral edge (overlap portion) of the low-potential pad opening 143.

The second portion 147 is formed at an interval from the first portion 146 and exposes the inorganic insulating layer 140 between the first portion 146 and the second portion 147. The second portion 147 has a plurality of high-potential terminal openings 149 exposing the plurality of high-potential terminals 12 (the high-potential pad openings 144), respectively. The second portion 147 may have an overlap portion overlying the peripheral edge (overlap portion) of the high-potential pad opening 144.

The second portion 147 collectively covers the transformers 21A to 21D and the dummy pattern 85. Specifically, the second portion 147 collectively covers the plurality of high-potential coils 23, the plurality of high-potential terminals 12, the first high-potential dummy pattern 87, the second high-potential dummy pattern 88, and the floating dummy pattern 121.

The embodiment of the present disclosure may be implemented in other forms. In the above embodiment, an example in which the first functional device 45 and the second functional device 60 are formed has been described. However, a form having only the second functional device 60 without having the first functional device 45 may be adopted. In this case, the dummy pattern 85 may be removed. According to this structure, the second functional device can achieve the same effects as those described in the first embodiment (excluding the effects related to the dummy pattern 85).

That is, when a voltage is applied to the second functional device 60 via the low-potential terminals 11A to 11F and the high-potential terminals 12A to 12F, unwanted conduction between the high-potential terminals 12A to 12F and the seal conductor 61 can be suppressed. Further, when a voltage is applied to the second functional device 60 via the low-potential terminals 11A to 11F and the high-potential terminals 12A to 12F, unwanted conduction between the low-potential terminals 11A to 11F and the seal conductor 61 can be suppressed.

Further, in the above embodiment, an example in which the second functional device 60 is formed has been described. However, the second functional device 60 is not necessarily required and may be removed.

Further, in the above embodiment, an example in which the dummy pattern 85 is formed has been described. However, the dummy pattern 85 is not necessarily required and may be removed.

Further, in the above embodiment, an example in which the first functional device 45 is of a multi-channel type including the plurality of transformers 21 has been described. However, a single-channel first functional device 45 including a single transformer 21 may be employed.

<Transformer Arrangement>

Figure 9:
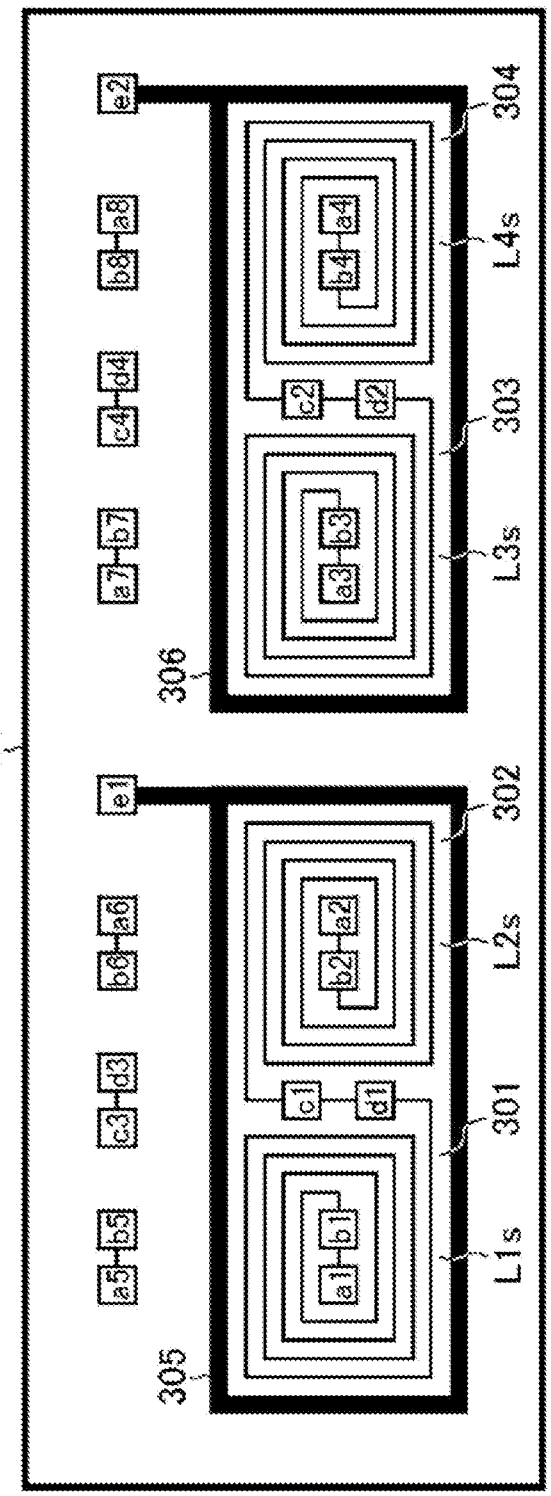
FIG. 9 is a view schematically showing a layout example of a transformer chip.

FIG. 9 is a plan view (top view) schematically showing an example of transformer arrangement in a two-channel transformer chip 300 (corresponding to the above-described semiconductor device 5). The transformer chip 300 in this figure includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to a first end of a secondary side coil L1s forming the first transformer 301, and the pads c1 and d1 are connected to a second end of the secondary side coil L1s. The pads a2 and b2 are connected to a first end of a secondary side coil L2s forming the second transformer 302, and the pads c1 and d1 are connected to a second end of the secondary side coil L2s.

Further, the pads a3 and b3 are connected to a first end of a secondary side coil L3s forming the third transformer 303, and the pads c2 and d2 are connected to a second end of the secondary side coil L3s. The pads a4 and b4 are connected to a first end of a secondary side coil L4s forming the fourth transformer 304, and the pads c2 and d2 are connected to a second end of the secondary side coil L4s.

A primary side coil forming the first transformer 301, a primary side coil forming the second transformer 302, a primary side coil forming the third transformer 303, and a primary side coil forming the fourth transformer 304 are not shown in this figure. However, the primary side coils basically have the same configuration as the secondary side coils L1s to L4s, respectively, and are arranged directly below the secondary side coils L1s to L4s, respectively, so as to face the secondary side coils L1s to L4s, respectively.

That is, the pads a5 and b5 are connected to a first end of the primary side coil forming the first transformer 301, and the pads c3 and d3 are connected to a second end of the primary side coil of the first transformer 301. The pads a6 and b6 are connected to a first end of the primary side coil forming the second transformer 302, and the pads c3 and d3 are connected to a second end of the primary side coil of the second transformer 302.

Further, the pads a7 and b7 are connected to a first end of the primary side coil forming the third transformer 303, and the pads c4 and d4 are connected to a second end of the primary side coil of the third transformer 303. The pads a8 and b8 are connected to a first end of the primary side coil forming the fourth transformer 304, and the pads c4 and d4 are connected to a second end of the primary side coil of the fourth transformer 304.

However, the pads a5 to a8, the pads b5 to b8, the pads c3 and c4, and the pads d3 and d4 are led out from the inside of the transformer chip 300 to the surface thereof through vias (not shown).

Among the plurality of pads, the pads a1 to a8 correspond to first current supply pads, respectively, and the pads b1 to b8 correspond to first voltage measurement pads, respectively. Further, the pads c1 to c4 correspond to second current supply pads, respectively, and the pads d1 to d4 correspond to second voltage measurement pads, respectively.

Therefore, with the transformer chip 300 of this configuration example, the series resistance component of each coil can be accurately measured during the inspection of defective products. Therefore, in addition to rejecting defective products in which each coil is disconnected, it is possible to appropriately reject defective products in which the resistance value of each coil is abnormal (for example, a short circuit between coils), and consequently, it is possible to prevent the outflow of defective products to the market.

For the transformer chip 300 that has passed the defective product inspection, the plurality of pads may be used as means for connection with the primary side chip and the secondary side chip (for example, the controller chip 210 and the driver chip 220 described above).

Specifically, the pads a1 and b1, the pads a2 and b2, the pads a3 and b3, and the pads a4 and b4 may be connected to the signal input terminal or signal output terminal of the secondary chip. Further, the pads c1 and d1 and the pads c2 and d2 may be connected to the common voltage application terminal (GND2) of the secondary chip.

On the other hand, the pads a5 and b5, the pads a6 and b6, the pads a7 and b7, and the pads a8 and b8 may be connected to the signal input terminal or signal output terminal of the primary chip. Further, the pads c3 and d3 and the pads c4 and d4 may be connected to the common voltage application terminal (GND1) of the primary chip.

Here, as shown in FIG. 9, the first to fourth transformers 301 to 304 are coupled and arranged for the respective signal transmission directions. Referring to this figure, for example, the first transformer 301 and the second transformer 302, which transmit signals from the primary chip to the secondary chip, are formed in a first pair by the first guard ring 305. Further, for example, the third transformer 303 and the fourth transformer 304, which transmit signals from the secondary chip to the primary chip, are formed in a second pair by the second guard ring 306.

The reason for such coupling is to secure a withstand voltage between the primary side coil and the secondary side coil in case that the primary side coil and the secondary side coil forming each of the first to fourth transformers 301 to 304 are stacked in the vertical direction of the substrate of the transformer chip 300. However, the first guard ring 305 and the second guard ring 306 are not necessarily essential components.

Further, the first guard ring 305 and the second guard ring 306 may be connected to a low-impedance wiring such as a ground terminal via pads e1 and e2, respectively.

Further, in the transformer chip 300, the pads c1 and d1 are shared between the secondary side coil L1s and the secondary side coil L2s. Further, the pads c2 and d2 are shared between the secondary side coil L3s and the secondary side coil L4s. Further, the pads c3 and d3 are shared between the primary side coil L1p and the primary side coil L2p. Further, the pads c4 and d4 are shared with the corresponding respective primary side coils. With such a configuration, the number of pads can be reduced, and the downsizing of the transformer chip 300 can be achieved.

Further, as shown in FIG. 9, it is desirable that the primary side coil and the secondary side coil forming each of the first to fourth transformers 301 to 304 are wound in a rectangular shape (or a track shape with rounded corners) in a plan view of the transformer chip 300. With such a configuration, an area of a portion where the primary side coil and the secondary side coil overlap becomes large, which makes it possible to improve the transmission efficiency of the transformer.

Of course, the transformer arrangement in this figure is merely an example, and the number, shape, and arrangement of coils and the arrangement of pads are arbitrary. Further, the chip structure, the transformer arrangement, and the like described so far may be applied to general semiconductor devices in which coils are integrated on a semiconductor chip.

Signal Transmission Device (First Embodiment)

Figure 10:
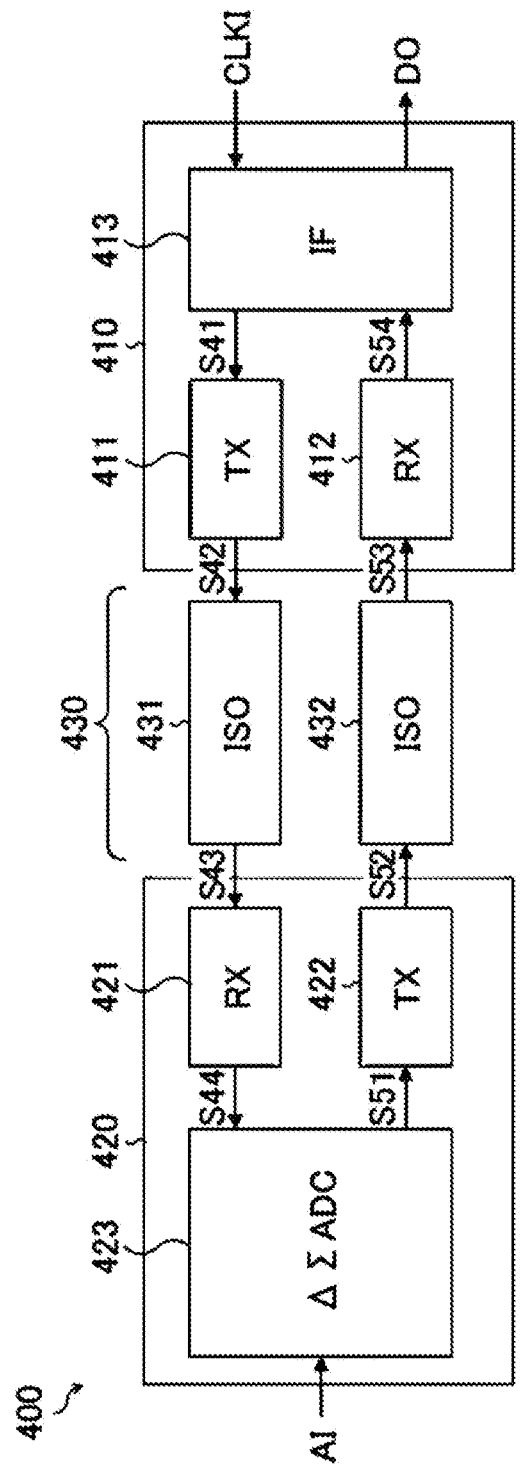
FIG. 10 is a diagram showing a first embodiment of the signal transmission device.

FIG. 10 is a diagram showing a first embodiment of the signal transmission device. The signal transmission device 400 of the first embodiment is an insulation ADC (analog-to-digital converter), in which a first chip 410, a second chip 420, and a third chip 430 are sealed in a single package.

The first chip 410 is a control side chip provided in a primary circuit system. For example, a first pulse transmitting circuit 411, a second pulse receiving circuit 412, and an interface 413 are integrated in the first chip 410.

The first pulse transmitting circuit 411 generates a first transmission pulse signal S42 in synchronization with a first reference clock signal S41 (external input clock signal CLKI).

The second pulse receiving circuit 412 receives a second reception pulse signal S53 and generates a second digital signal S54.

The interface 413 outputs the external input clock signal CLKI to the first pulse transmitting circuit 411, as the first reference clock signal S41. Further, the interface 413 outputs the second digital signal S54, which is output from the second pulse receiving circuit 412, to the outside, as a digital output signal DO.

The second chip 420 is a measurement side chip ADC provided in a secondary circuit system. For example, a first pulse receiving circuit 421, a second pulse transmitting circuit 422, and an analog/digital converting circuit 423 are integrated in the second chip 420.

The first pulse receiving circuit 421 receives a first reception pulse signal S43 and generates a second reference clock signal S44.

The second pulse transmitting circuit 422 generates a second transmission pulse signal S52 corresponding to a logic level of a first digital signal S51 in synchronization with the second reference clock signal S44.

The analog/digital converting circuit 423 converts an analog input signal AI, which is input from an outside, into the first digital signal S51 in synchronization with the second reference clock signal S44. It is desirable that a ΔΣ ADC or the like is used as the analog/digital converting circuit 423.

The third chip 430 is an insulation communication chip provided between the primary circuit system and the secondary circuit system (between the first chip 410 and the second chip 420). For example, a first insulation communication circuit 431 and a second insulation communication circuit 432 are integrated in the third chip 430.

The first insulation communication circuit 431 insulates between the first pulse transmitting circuit 411 and the first pulse receiving circuit 421 and transmits the first transmission pulse signal S42 as the first reception pulse signal S43.

The second insulation communication circuit 432 insulates between the second pulse transmitting circuit 422 and the second pulse receiving circuit 412 and transmits the second transmission pulse signal S52 as the second reception pulse signal S53.

As an insulation method for each of the first insulation communication circuit 431 and the second insulation communication circuit 432, it is desirable that a transformer insulation method (coil insulation method), a capacitive insulation method, or the like is used.

Both the first insulation communication circuit 431 and the second insulation communication circuit 432 are integrated in the third chip 430 which is provided independently from the first chip 410 and the second chip 420. With this configuration, the first chip 410 and the second chip 420 can each be formed by an inexpensive low-to medium withstand voltage process (withstand voltage of several volts to several tens of volts).

However, the configuration in this figure is merely an example, and the third chip 430 may be omitted. In that case, the first insulation communication circuit 431 and the second insulation communication circuit 432 may be integrated in the first chip 410 or the second chip 420.

Further, the second chip 420 may be divided into, for example, an insulation communication chip on which the first pulse receiving circuit 421 and the second pulse transmitting circuit 422 are mounted, and a measurement chip on which the analog/digital converting circuit 423 is mounted.

Figure 11:
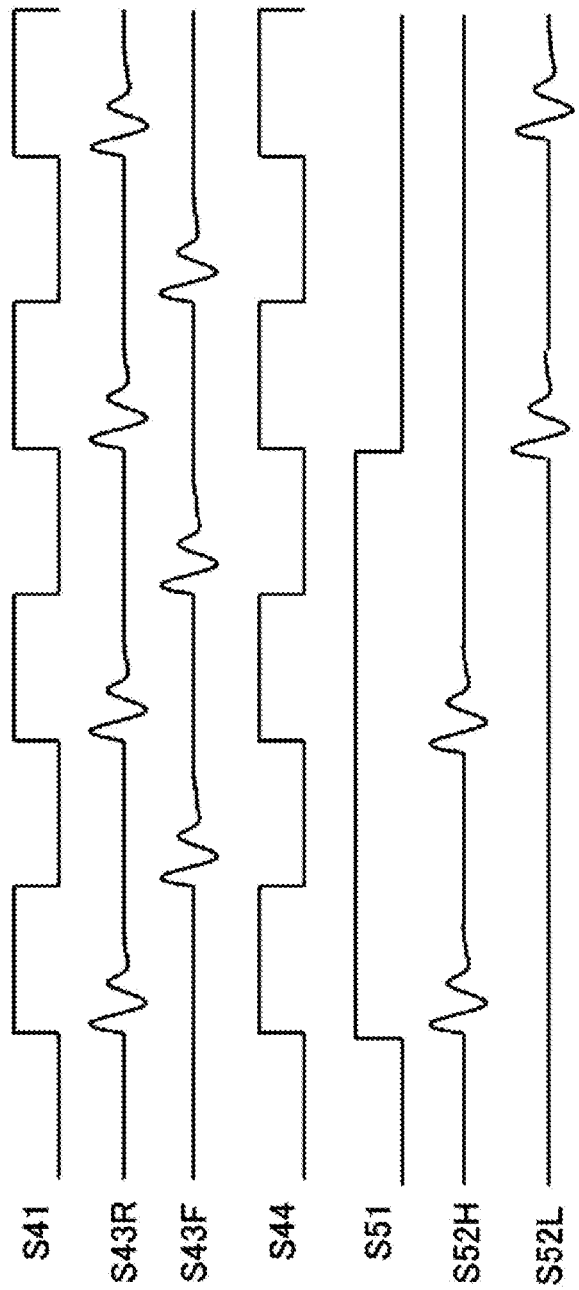
FIG. 11 is a diagram showing a signal transmission operation of the first embodiment.

FIG. 11 is a diagram showing a signal transmission operation of the first embodiment, where the first reference clock signal S41, first reception pulse signals S43R and S43F, the second reference clock signal S44, the first digital signal S51, and second transmission pulse signals S52H and S52L are sequentially depicted from top to bottom.

The first reception pulse signals S43R and S43F correspond to the above-mentioned first reception pulse signal S43. Referring to this figure, the first reception pulse signal S43R for transmitting a rising edge of the first reference clock signal S41 is pulse-driven in synchronization with the rising edge of the first reference clock signal S41. On the other hand, the first reception pulse signal S43F for transmitting a falling edge of the first reference clock signal S41 is pulse-driven in synchronization with the falling edge of the first reference clock signal S41.

The second reference clock signal S44 rises to a high level in response to pulse-driving of the first reception pulse signal S43R, and falls to a low level in response to pulse-driving of the first reception pulse signal S43F. Therefore, the second reference clock signal S44 has the same oscillation frequency and duty as the first reference clock signal S41 (consequently, the external input clock signal CLKI).

That is, in the signal transmission device 400 of the first embodiment, the external input clock signal CLKI, which is input from an outside to the first chip 410, is transmitted to the second chip 420 through the first pulse transmitting circuit 411, the first insulation communication circuit 431, and the first pulse receiving circuit 421.

The analog/digital converting circuit 423 alternately repeats two operating states according to the logic level of the second reference clock signal S44, so that the analog input signal AI is converted into the first digital signal S51. Therefore, the logic level (data) of the first digital signal S51 is determined per each cycle of the second reference clock signal S44.

The second transmission pulse signals S52H and S52L correspond to the above-mentioned second transmission pulse signal S52. Referring to this figure, the second transmission pulse signal S52H for high level transmission is pulse-driven in synchronization with the rising edge of the second reference clock signal S44 during the high level period of the first digital signal S51. On the other hand, the second transmission pulse signal S52L for low level transmission is pulse-driven in synchronization with the rising edge of the second reference clock signal S44 during the low level period of the first digital signal S51.

Although not explicitly shown in this figure, the second transmission pulse signals S52H and S52L are transmitted to the second pulse receiving circuit 412 through the second insulation communication circuit 432 and are subjected to a process of generating the second digital signal S54. The second digital signal S54 basically has the same logic level as the first digital signal S51 and is externally output as the digital output signal DO.

That is, in the signal transmission device 400 of the first embodiment, the analog input signal AI, which is input from an outside to the second chip 420, is analog/digital-converted, is transmitted to the first chip 410 through the second pulse transmitting circuit 422, the second insulation communication circuit 432, and the second pulse receiving circuit 412, and is externally output as the digital output signal DO.

Thus, the signal transmission device 400 of the first embodiment can transmit various pulse signals (reference clock signal, digital signal, etc.) while insulating between the first chip 410 and the second chip 420.

However, in the signal transmission device 400 of the first embodiment, as a process of transmitting a clock from the first chip 410 to the second chip 420, pulse drive of two systems synchronized with the rising edge and falling edge of the first reference clock signal S41 is performed. Therefore, the current consumption of the first insulation communication circuit 431 is relatively large.

Signal Transmission Device (Second Embodiment)

Figure 12:
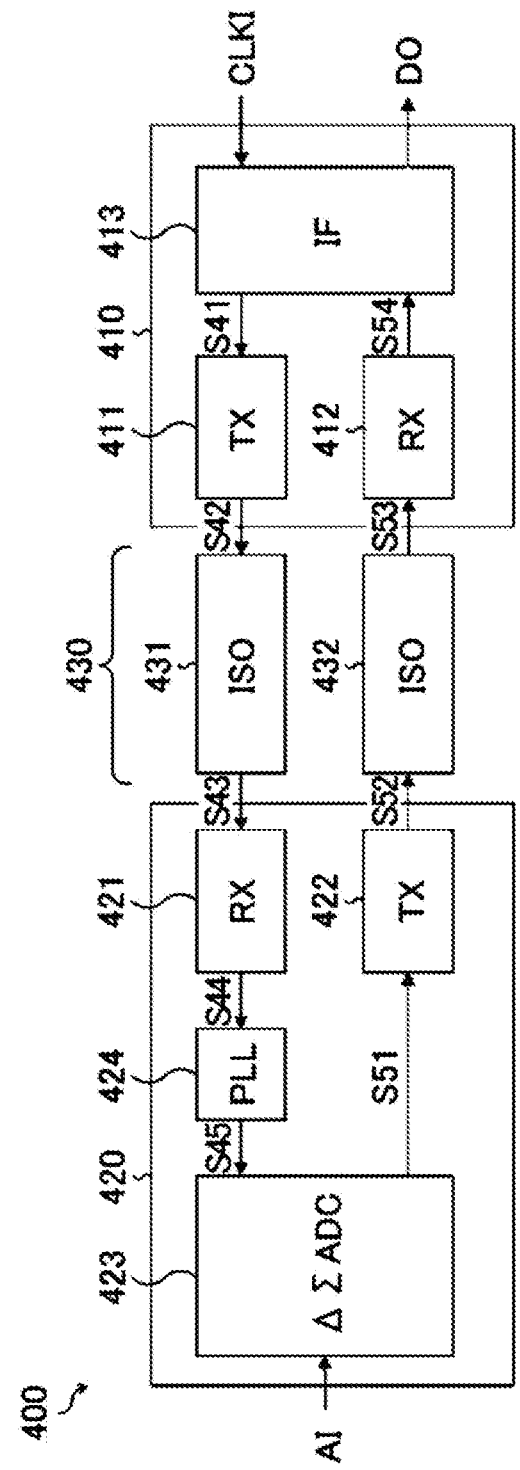
FIG. 12 is a diagram showing a second embodiment of the signal transmission device.

FIG. 12 is a diagram showing a second embodiment of the signal transmission device. The signal transmission device 400 of the second embodiment is based on the above-described first embodiment (FIG. 10) and includes a drive clock signal generating circuit 424 added to the second chip 420.

The drive clock signal generating circuit 424 is provided between the first pulse receiving circuit 421 and the analog/digital converting circuit 423. The drive clock signal generating circuit 424 generates a drive clock signal S45 having a predetermined oscillation frequency and a predetermined duty or a predetermined pulse width, in synchronization with the second reference clock signal S44.

As the drive clock signal generating circuit 424, it is desirable that a phase synchronization circuit (PLL (phase lock loop)) or a delay synchronization circuit (DLL (delay lock loop)) is used.

Further, with the addition of the drive clock signal generating circuit 424, the operations of the first pulse transmitting circuit 411 and the analog/digital converting circuit 423 are also changed.

Specifically, the first pulse transmitting circuit 411 generates the first transmission pulse signal S42 in synchronization with either the rising edge or the falling edge of the first reference clock signal S41 (the external input clock signal CLKI), which is output from the interface 413. For example, the first pulse transmitting circuit 411 performs pulse drive (single-shot or multiple-shot transmission pulse output) of the first transmission pulse signal S42 at the timing when the first reference clock signal S41 rises from a low level to a high level. Further, the analog/digital converting circuit 423 converts the analog input signal AI into the first digital signal S51 in synchronization with the drive clock signal S45 instead of the second reference clock signal S44.

Figure 13:
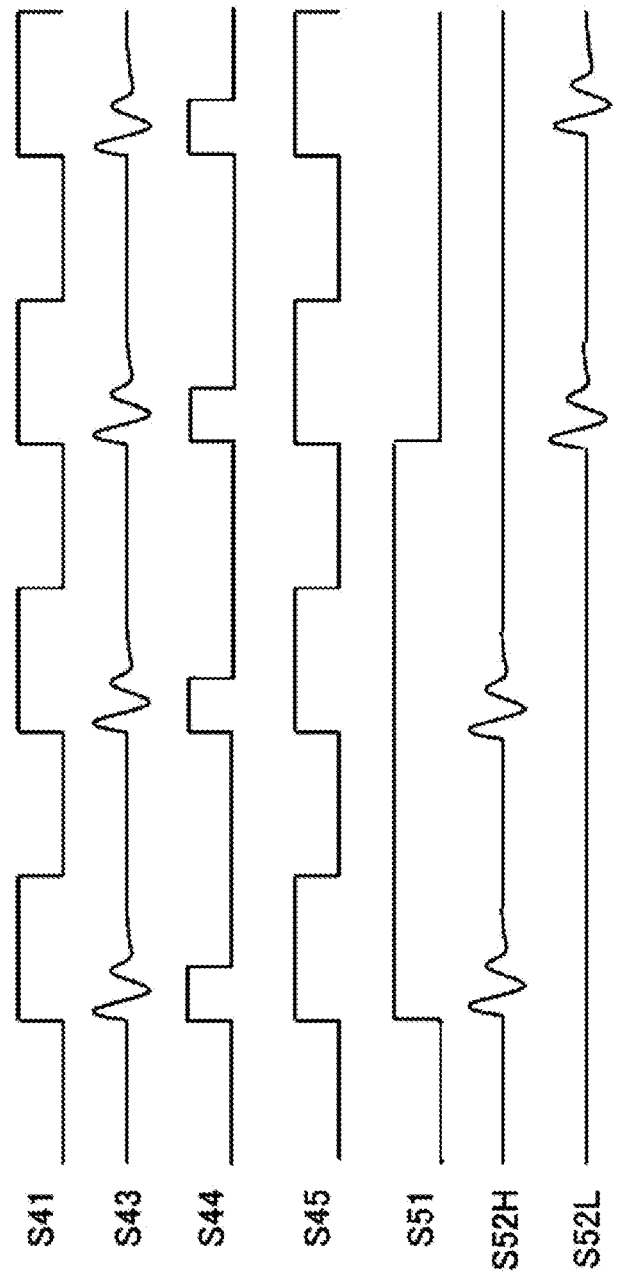
FIG. 13 is a diagram showing a signal transmission operation of the second embodiment.

FIG. 13 is a diagram showing a signal transmission operation of the second embodiment, where the first reference clock signal S41, the first reception pulse signal S43, the second reference clock signal S44, the drive clock signal S45, the first digital signal S51, and the second transmission pulse signals S52H and S52L are sequentially depicted from top to bottom.

The first reception pulse signal S43 is pulse-driven in synchronization with only the rising edge of the first reference clock signal S41.

The second reference clock signal S44 rises to a high level in response to pulse-driving of the first reception pulse signal S43 and then falls to a low level at an arbitrary timing. Therefore, the second reference clock signal S44 is a signal having the same oscillation frequency as the first reference clock signal S41 (consequently, the external input clock signal CLKI) but a different duty or pulse width.

The drive clock signal S45 is feedback-controlled so as to have the same duty or pulse width as the first reference clock signal S41 (consequently, the external input clock signal CLKI) while synchronizing with the second reference clock signal S44.

The analog/digital converting circuit 423 converts the analog input signal AI into the first digital signal S51 in synchronization with the drive clock signal S45. The subsequent operations are basically the same as those of the first embodiment (FIG. 10).

In this way, in the signal transmission device 400 of the second embodiment, as a process of transmitting a clock from the first chip 410 to the second chip 420, only timing information about the rising edge (or falling edge also possible) of the first reference clock signal S41 is transmitted. In other words, only pulse drive synchronized with the rising edge of the first reference clock signal S41 is performed. Therefore, it is possible to reduce the current consumption of the first insulation communication circuit 431 as compared with the first embodiment (FIG. 10).

Signal Transmission Device (Third Embodiment)

Figure 14:
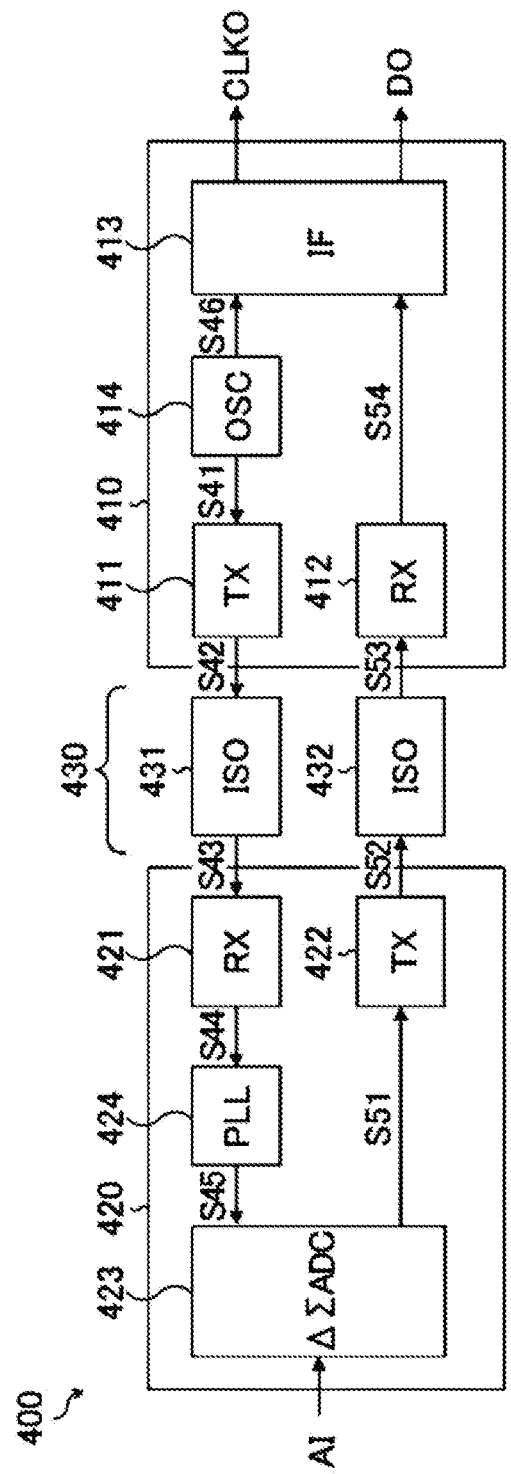
FIG. 14 is a diagram showing a third embodiment of the signal transmission device.

FIG. 14 is a diagram showing a third embodiment of the signal transmission device. The signal transmission device 400 of the third embodiment is based on the above-described second embodiment (FIG. 12) and includes an oscillator 414 added to the first chip 410. The oscillator 414 outputs an internal clock signal generated by itself to the first pulse transmitting circuit 411, as the first reference clock signal S41. Further, the oscillator 414 may externally output the internal clock signal S46 generated by itself via the interface 413, as an external output clock signal CLKO.

In this way, the first reference clock signal S41 does not necessarily have to be derived from the external input clock signal CLKI, but may be derived from the internal clock signal of the oscillator 414.

Signal Transmission Device (Fourth Embodiment)

Figure 15:
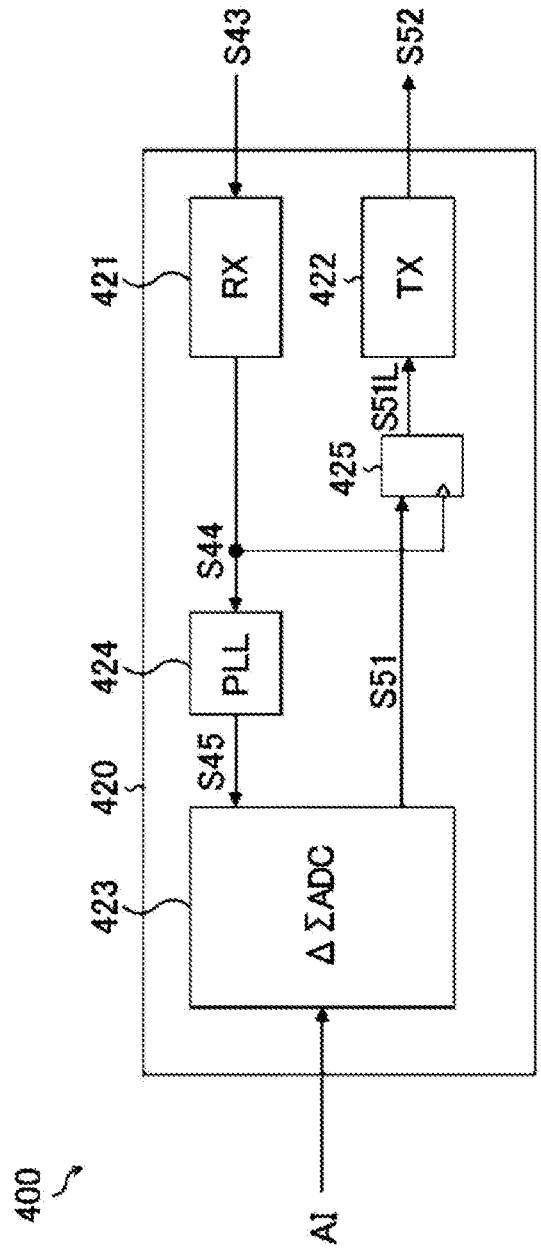
FIG. 15 is a diagram showing a fourth embodiment of the signal transmission device.

FIG. 15 is a diagram showing a fourth embodiment of the signal transmission device. The signal transmission device 400 of the fourth embodiment is based on the above-described second embodiment (FIG. 12) and includes a latch circuit 425 added to the second chip 420.

The latch circuit 425 latches and outputs the first digital signal S51 in synchronization with the second reference clock signal S44. For example, the latch circuit 425 holds a logic level of the first digital signal S51 in synchronization with the rising edge of the second reference clock signal S44, and outputs it to the second pulse transmitting circuit 422, as a latched first digital signal S51L. It is desirable that a D flip-flop or the like is used as the latch circuit 425.

The second pulse transmitting circuit 422 generates the second transmission pulse signal S52 according to the logic level of the latched first digital signal S51L.

Figure 16:
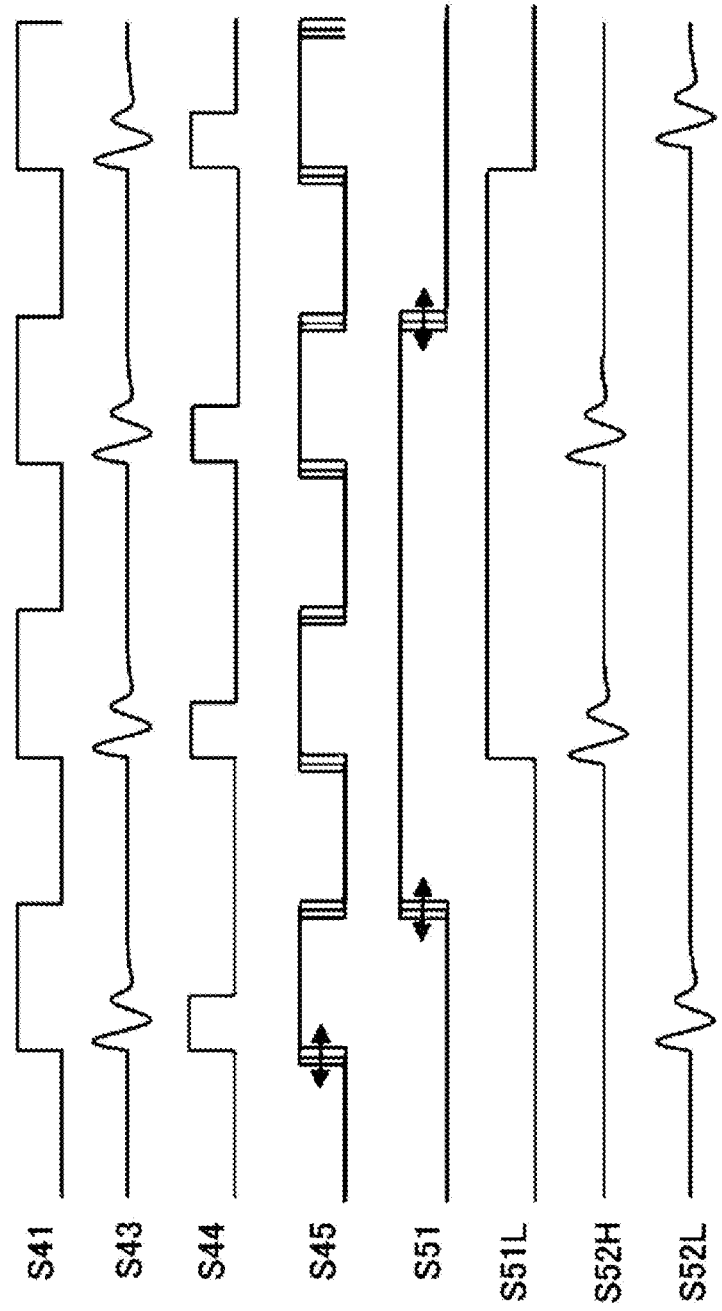
FIG. 16 is a diagram showing a signal transmission operation of the fourth embodiment.

FIG. 16 is a diagram showing a signal transmission operation of the fourth embodiment, where the first reference clock signal S41, the first reception pulse signal S43, the second reference clock signal S44, the drive clock signal S45, the first digital signal S51, the latched first digital signal S51L, and the second transmission pulse signals S52H and S52L are sequentially depicted from top to bottom.

As shown in this figure, the drive clock signal S45 has a jitter associated with signal processing (phase synchronization processing, delay synchronization processing, etc.) in the drive clock signal generating circuit 424. Therefore, a jitter may also occur in the first digital signal S51 generated in synchronization with the drive clock signal S45.

On the other hand, since the second reference clock signal S44 is not subjected to signal processing in the drive clock signal generating circuit 424, it does not have the above-mentioned jitter. Therefore, by latching and outputting the first digital signal S51 in synchronization with the second reference clock signal S44, it is less susceptible to the jitter occurring in the drive clock signal S45 (consequently, the first digital signal S51).

Signal Transmission Device (Fifth Embodiment)

Figure 17:
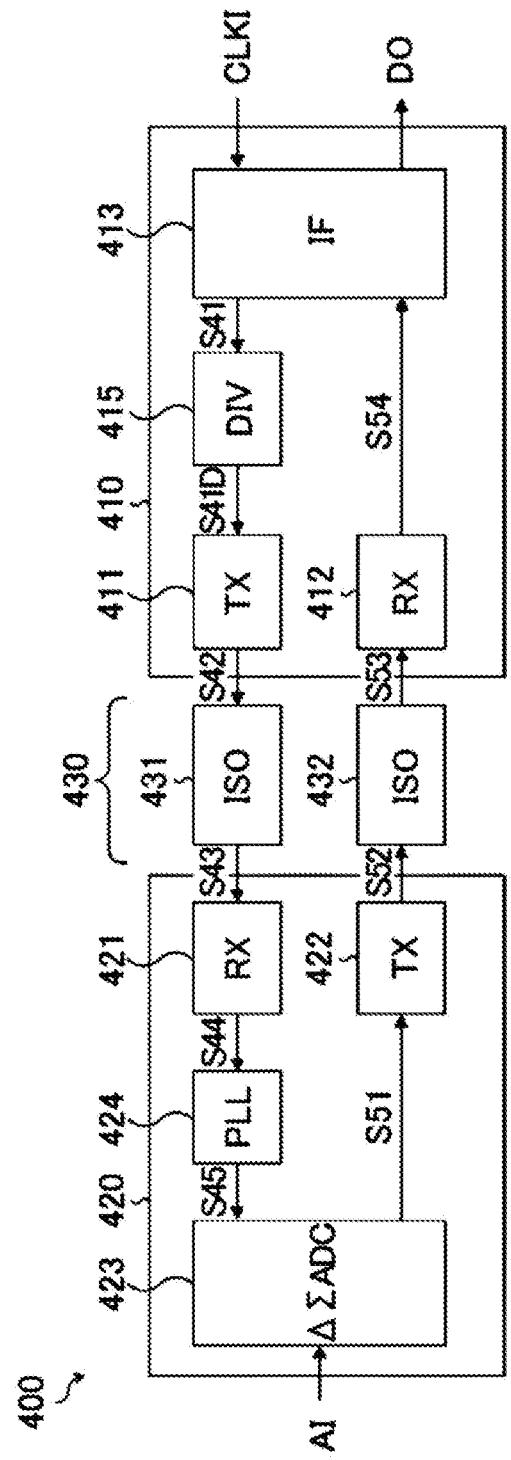
FIG. 17 is a diagram showing a fifth embodiment of the signal transmission device.

FIG. 17 is a diagram showing a fifth embodiment of the signal transmission device. The signal transmission device 400 of the fifth embodiment is based on the above-described second embodiment (FIG. 12) and includes a frequency dividing circuit 415 added to the first chip 410.

The frequency dividing circuit 415 is provided between the interface 413 and the first pulse transmitting circuit 411. The frequency dividing circuit 415 outputs a frequency-divided clock signal S41D obtained by frequency-dividing the first reference clock signal S41 (consequently, the external input clock signal CLKI), instead of the first reference clock signal S41, to the first pulse transmitting circuit 411.

FIG. 18 is a diagram showing a signal transmission operation of the fifth embodiment, where the first reference clock signal S41, the frequency-divided clock signal S41D, the first reception pulse signal S43, the second reference clock signal S44, the drive clock signal S45, the first digital signal S51, and the second transmission pulse signals S52H and S52L are sequentially depicted from top to bottom.

The frequency-divided clock signal S41D has the same duty as the first reference clock signal S41, but the oscillation frequency is divided by ½. Therefore, the first reception pulse signal S43 (consequently, the second reference clock signal S44) generated in synchronization with only the rising edge of the frequency-divided clock signal S41D is in a state in which pulses are thinned out as compared to the above-described second embodiment (FIG. 13). As a result, it is possible to further reduce the current consumption of the first insulation communication circuit 431.

When the number of pulses of the second reference clock signal S44 is thinned out to ½ of the original number of pulses, the drive clock signal generating circuit 424 may double the second reference clock signal S44 and use the doubled second reference clock signal S44 to generate the drive clock signal S45.

Further, the second transmission pulse signals S52H and S52L may be pulse-driven in synchronization with the drive clock signal S45 instead of the second reference clock signal S44. Referring to this figure, the second transmission pulse signal S52H is pulse-driven in synchronization with the rising edge of the drive clock signal S45 during the high level period of the first digital signal S51. On the other hand, the second transmission pulse signal S52L is pulse-driven in synchronization with the rising edge of the drive clock signal S45 during the low level period of the first digital signal S51.

With such a configuration, even when the number of pulses of the first reception pulse signal S43 (consequently, the second reference clock signal S44) is thinned out, there is no problem in generating the first digital signal S51 and the second transmission pulse signals S52H and S52L.

Combination of Embodiments

It should be noted that the first to fifth embodiments described so far may be combined as appropriate and implemented unless contradictory. For example, although not shown again, by combining the third embodiment (FIG. 14) and the fifth embodiment (FIG. 17), the internal clock signal generated by the oscillator 414 may be frequency-divided and output to the first pulse transmitting circuit 411.

SUMMARY

In the following, the various embodiments described above will be comprehensively described.

For example, a signal transmission device disclosed herein has a configuration (first configuration) that includes: a first pulse transmitting circuit configured to generate a first transmission pulse signal in synchronization with one of a rising edge and a falling edge of a first reference clock signal; a first pulse receiving circuit configured to receive a first reception pulse signal and generate a second reference clock signal; a first insulation communication circuit configured to transmit the first transmission pulse signal as the first reception pulse signal while insulating between the first pulse transmitting circuit and the first pulse receiving circuit; and a drive clock signal generating circuit configured to generate a drive clock signal having a predetermined oscillation frequency and a predetermined duty or a predetermined pulse width in synchronization with the second reference clock signal.

The signal transmission device of the first configuration may have a configuration (second configuration) in which the drive clock signal generating circuit is a phase synchronization circuit or a delay synchronization circuit.

The signal transmission device of the first or second configuration may have a configuration (third configuration) that further includes an interface configured to output an external input clock signal as the first reference clock signal.

The signal transmission device of the first or second configuration may have a configuration (fourth configuration) that further includes an oscillator configured to output an internal clock signal as the first reference clock signal.

The signal transmission device of any one of the first to fourth configurations may have a configuration (fifth configuration) that further includes a frequency dividing circuit configured to output a frequency-divided clock signal, which is obtained by frequency-dividing an external input clock signal or an internal clock signal, as the first reference clock signal.

The signal transmission device of any one of the first to fifth configurations may have a configuration (sixth configuration) that further includes an analog/digital converting circuit configured to convert an analog input signal into a first digital signal in synchronization with the drive clock signal.

The signal transmission device of the sixth configuration may have a configuration (seventh configuration) that further includes: a second pulse transmitting circuit configured to generate a second transmission pulse signal according to a logic level of the first digital signal; a second pulse receiving circuit configured to receive a second reception pulse signal and generate a second digital signal; and a second insulation communication circuit configured to transmit the second transmission pulse signal as the second reception pulse signal while insulating between the second pulse transmitting circuit and the second pulse receiving circuit.

The signal transmission device of the seventh configuration may have a configuration (eighth configuration) that further includes a latch circuit configured to latch and output the first digital signal to the second pulse transmitting circuit in synchronization with the second reference clock signal.

The signal transmission device of the seventh or eighth configuration may have a configuration (ninth configuration) that further includes: a first chip configured to integrate the first pulse transmitting circuit and the second pulse receiving circuit; and a second chip configured to integrate the first pulse receiving circuit, the second pulse transmitting circuit, the drive clock signal generating circuit, and the analog/digital converting circuit.

The signal transmission device of the ninth configuration may have a configuration (tenth configuration) in which each of the first insulation communication circuit and the second insulation communication circuit is integrated into the first chip, the second chip, or a separate third chip.

<Other Modifications>

It should be noted that various technical features disclosed herein can be modified in various ways in addition to the above embodiments without departing from the gist of the technical creation. That is, the above embodiments should be considered as examples and not restrictive in all respects. The technical scope of the present disclosure is defined by the claims, and it should be understood that all changes that come within the meaning and range of equivalents of the claims are included in the technical scope of the present disclosure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A signal transmission device comprising:
    a first pulse transmitting circuit configured to generate a first transmission pulse signal in synchronization with one of a rising edge and a falling edge of a first reference clock signal;
    a first pulse receiving circuit configured to receive a first reception pulse signal and generate a second reference clock signal;
    a first insulation communication circuit configured to transmit the first transmission pulse signal as the first reception pulse signal while insulating between the first pulse transmitting circuit and the first pulse receiving circuit; and
    a drive clock signal generating circuit configured to generate a drive clock signal having a predetermined oscillation frequency and a predetermined duty or a predetermined pulse width in synchronization with the second reference clock signal.

2. The signal transmission device of claim 1, wherein the drive clock signal generating circuit is a phase synchronization circuit or a delay synchronization circuit.

3. The signal transmission device of claim 1, further comprising an interface configured to output an external input clock signal as the first reference clock signal.

4. The signal transmission device of claim 1, further comprising an oscillator configured to output an internal clock signal as the first reference clock signal.

5. The signal transmission device of claim 1, further comprising a frequency dividing circuit configured to output a frequency-divided clock signal, which is obtained by frequency-dividing an external input clock signal or an internal clock signal, as the first reference clock signal.

6. The signal transmission device of claim 1, further comprising an analog/digital converting circuit configured to convert an analog input signal into a first digital signal in synchronization with the drive clock signal.

7. The signal transmission device of claim 6, further comprising:
    a second pulse transmitting circuit configured to generate a second transmission pulse signal according to a logic level of the first digital signal;
    a second pulse receiving circuit configured to receive a second reception pulse signal and generate a second digital signal; and
    a second insulation communication circuit configured to transmit the second transmission pulse signal as the second reception pulse signal while insulating between the second pulse transmitting circuit and the second pulse receiving circuit.

8. The signal transmission device of claim 7, further comprising a latch circuit configured to latch and output the first digital signal to the second pulse transmitting circuit in synchronization with the second reference clock signal.

9. The signal transmission device of claim 7, further comprising:
    a first chip configured to integrate the first pulse transmitting circuit and the second pulse receiving circuit; and
    a second chip configured to integrate the first pulse receiving circuit, the second pulse transmitting circuit, the drive clock signal generating circuit, and the analog/digital converting circuit.

10. The signal transmission device of claim 9, wherein each of the first insulation communication circuit and the second insulation communication circuit is integrated into the first chip, the second chip, or a separate third chip.

* * * * *